United States Patent
Dai et al.

(10) Patent No.: US 12,243,902 B2
(45) Date of Patent: Mar. 4, 2025

(54) IMAGE SENSOR, METHOD FOR OBTAINING IMAGE DATA FROM IMAGE SENSOR, AND CAMERA DEVICE

(71) Applicant: HUAWEI TECHNOLOGIES CO., LTD., Guangdong (CN)

(72) Inventors: Yufeng Dai, Dongguan (CN); Hongyi Qin, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 778 days.

(21) Appl. No.: 17/231,319

(22) Filed: Apr. 15, 2021

(65) Prior Publication Data
US 2021/0233953 A1    Jul. 29, 2021

Related U.S. Application Data

(63) Continuation of application No. PCT/CN2019/116762, filed on Nov. 8, 2019.

(51) Int. Cl.
*H01L 27/146* (2006.01)
*H04N 25/77* (2023.01)

(52) U.S. Cl.
CPC .. *H01L 27/14645* (2013.01); *H01L 27/14621* (2013.01); *H04N 25/77* (2023.01)

(58) Field of Classification Search
CPC ......... H01L 27/14645; H01L 27/14621; H01L 27/14605; H01L 27/14627; H04N 25/77; H04N 23/84; H04N 25/133; H04N 25/134; H04N 25/136
See application file for complete search history.

(56) References Cited

U.S. PATENT DOCUMENTS

| | | | |
|---|---|---|---|
| 7,872,681 B2 | 1/2011 | Davidovici | |
| 8,759,742 B2 * | 6/2014 | Yokogawa | ........... H04N 25/135 250/225 |
| 9,201,180 B2 | 12/2015 | Song et al. | |
| 9,467,665 B1 * | 10/2016 | Wang | ..................... G02B 5/201 |
| 2007/0024931 A1 | 2/2007 | Compton et al. | |

(Continued)

FOREIGN PATENT DOCUMENTS

| | | |
|---|---|---|
| CN | 101150731 B | 5/2012 |
| CN | 101473439 B | 3/2013 |

(Continued)

*Primary Examiner* — Jonathan Han
(74) *Attorney, Agent, or Firm* — WOMBLE BOND DICKINSON (US) LLP

(57) ABSTRACT

This application discloses an image sensor, which includes a color film layer. The color film layer includes a plurality of color film units, the color film unit includes at least one color-determined subunit and at least three transparent subunits, and a color of the color-determined subunit is determined. The color-determined subunit is configured to filter out a portion of the received light, and the transparent subunit is configured to allow light to pass through. A ratio of a quantity of the at least one color-determined subunit to a quantity of the plurality of subunits is less than 1/2. Because the transparent subunit can allow light to pass through, and most of light incident to the color film layer can be received by a photodiode, light sensitivity of the image sensor can be effectively increased without increasing an area of the color film layer or increasing a size of the photodiode.

19 Claims, 20 Drawing Sheets

(56) References Cited

U.S. PATENT DOCUMENTS

| | | | |
|---|---|---|---|
| 2007/0076269 A1 | 4/2007 | Kido et al. | |
| 2008/0316345 A1 | 12/2008 | Onodera | |
| 2013/0242148 A1 | 9/2013 | Mlinar et al. | |
| 2014/0231621 A1* | 8/2014 | Tsau | H01L 27/14621 250/208.1 |
| 2015/0222833 A1* | 8/2015 | Murata | H04N 25/702 250/208.1 |
| 2016/0191866 A1 | 6/2016 | Onishi et al. | |
| 2016/0337623 A1* | 11/2016 | Onishi | H04N 25/75 |
| 2017/0115436 A1* | 4/2017 | Qian | H04N 23/11 |
| 2017/0315278 A1 | 11/2017 | Hsieh et al. | |
| 2017/0330910 A1 | 11/2017 | Liu | |

FOREIGN PATENT DOCUMENTS

| | | |
|---|---|---|
| CN | 101681506 B | 3/2013 |
| CN | 104010173 A | 8/2014 |
| CN | 104412580 A | 3/2015 |
| CN | 104581100 A | 4/2015 |
| CN | 104754321 A | 7/2015 |
| CN | 105210369 A | 12/2015 |
| CN | 205726019 U | 11/2016 |
| CN | 207558799 U | 6/2018 |
| CN | 108513112 A | 9/2018 |
| CN | 109905681 A | 6/2019 |
| EP | 3182453 A1 | 6/2017 |

* cited by examiner

| | C | M | C | M | C | M | C | M |
|---|---|---|---|---|---|---|---|---|
| 211 → | | Y | | Y | | Y | | Y |
| | C | M | C | M | C | M | C | M |
| | | Y | | Y | | Y | | Y |
| | C | M | C | M | C | M | C | M |
| | | Y | | Y | | Y | | Y |
| | C | M | C | M | C | M | C | M |
| | | Y | | Y | | Y | | Y |

| B | R | G | R | B | R | G | R |
|---|---|---|---|---|---|---|---|
| R |   | B |   | R |   | B |   |
| G | B | R | B | G | B | R | B |
| R |   | B |   | R |   | B |   |
| B | R | G | R | B | R | G | R |
| R |   | B |   | R |   | B |   |
| G | B | R | B | G | B | R | B |
| R |   | B |   | B |   | B |   |

FIG. 34

| B | R | G | R | B | R | G | R |
|---|---|---|---|---|---|---|---|
| R | G | B | G | R | G | B | G |
| G | B | R | B | G | B | R | B |
| R | G | B | G | R | G | B | G |
| B | R | G | R | B | R | G | R |
| R | G | B | G | R | G | B | G |
| G | B | R | B | G | B | R | B |
| R | G | B | G | B | G | B | G |

FIG. 35

IMAGE SENSOR, METHOD FOR OBTAINING IMAGE DATA FROM IMAGE SENSOR, AND CAMERA DEVICE

CROSS-REFERENCE TO RELATED APPLICATIONS

This application is a continuation of International Application No. PCT/CN2019/116762, filed on Nov. 8, 2019, which claims priority to Chinese Patent Application No. 201910105272.0, filed on Feb. 1, 2019. The disclosures of the aforementioned applications are hereby incorporated by reference in their entireties.

TECHNICAL FIELD

This application relates to the field of electronic technology application, and in particular, to an image sensor, a method for obtaining image data from the image sensor, and a camera device.

BACKGROUND

An image sensor is a device capable of implementing a photoelectric conversion function, and is widely applied to a camera device. The image sensor includes a color film layer and a photodiode. The color film layer is configured to filter light to obtain light of different colors. The photodiode is configured to receive the light obtained after filtering and convert an optical signal corresponding to the light into an electrical signal, where the electrical signal is used by a subsequent module to perform processing to obtain an image. A luminance of the image is related to an amount of light received by the photodiode in the image sensor. When the camera device collects an image in an environment with relatively low light intensity, if the photodiode in the image sensor receives a relatively small amount of light, the collected image is blurred due to a relatively low luminance.

In a related technology, a manner such as increasing an area of a color film layer to increase a size of a photodiode is usually used to improve light sensitivity of an image sensor, so as to ensure that more light can be transmitted to the photodiode.

However, when resolution of the image sensor is given, if the area of the color film layer is increased to increase the size of the photodiode, a size of the image sensor is increased accordingly. Consequently, miniaturization of the image sensor cannot be implemented.

SUMMARY

This application provides an image sensor, a method for obtaining image data from the image sensor, and a camera device, to resolve a problem in a related technology that miniaturization of the image sensor cannot be implemented.

According to a first aspect, an image sensor is provided. The image sensor includes a color film layer, the color film layer includes a plurality of color film units, the color film unit includes at least one color-determined subunit and at least three transparent subunits, the color-determined subunit is configured to filter out a portion of received light, and the transparent subunit is configured to allow light to pass through; and a ratio of a quantity of the at least one color-determined subunit to a total quantity of subunits in the color film unit is less than 1/2.

According to the image sensor provided in this application, because the transparent subunit does not filter light, and all light incident to the transparent subunit can be received by a photodiode, light sensitivity of the image sensor can be increased without increasing an area of the color film layer or increasing a size of the photodiode, thereby implementing miniaturization of the image sensor. In addition, the ratio of the quantity of the at least one color-determined subunit to the total quantity of the plurality of subunits in the color film layer is controlled to be less than 1/2, thereby ensuring effectiveness of increasing light sensitivity of the image sensor.

In one embodiment, the color film unit includes four subunits, and the four subunits include one color-determined subunit and three transparent subunits. There may be the following two types of image sensors based on different types of color film layers.

In one embodiment, a color of the portion of the received light is a color other than a color of the color-determined subunit, the color film layer includes a plurality of color film unit arrays, and each color film unit array includes four color film units; and in three of the four color film units, the color-determined subunits are red, green, and blue, and in the other one of the four color film units, a color-determined subunit is red, green, or blue.

In one embodiment, the four color film units are arranged into one 2×2 color film unit matrix, and when the color-determined subunit in the other one color film unit is green, two color film units whose color-determined subunits are both green are diagonally arranged in the color film unit matrix.

In one embodiment, a color of the portion of the received light is a color other than a color of the color-determined subunit.

In every two adjacent color film units in the color film layer, the color-determined subunit in one color film unit is red, and the color-determined subunit in the other color film unit is blue;
  in every two adjacent color film units in the color film layer, the color-determined subunit in one color film unit is red, and the color-determined subunit in the other color film unit is green; or
  in every two adjacent color film units in the color film layer, the color-determined subunit in one color film unit is blue, and the color-determined subunit in the other color film unit is green.

In one embodiment, a color of the portion of the received light is a complementary color of the color of the color-determined subunit, the color film layer includes a plurality of color film unit arrays, and each color film unit array includes four color film units; and in three of the four color film units, colors of the color-determined subunits are cyan, yellow, and magenta, and in the other one of the four color film units, the color-determined subunit is cyan, yellow, or magenta.

In one embodiment, the four color film units are arranged into one 2×2 color film unit matrix, and when the color-determined subunit in the other one color film unit is magenta, two color film units whose color-determined subunits are both magenta are diagonally arranged in the color film unit matrix.

In one embodiment, a color of the portion of the received light is a complementary color of the color of the color-determined subunit; and in every two adjacent color film units in the color film layer, the color-determined subunit in one color film unit is cyan, and the color-determined subunit in the other color film unit is yellow;
  in every two adjacent color film units in the color film layer, the color-determined subunit in one color film unit is magenta, and the color-determined subunit in the other color film unit is yellow; or in every two adjacent color film units in the color film layer, the color-determined subunit in one color film unit is cyan, and the color-determined subunit in the other color film unit is magenta.

In one embodiment, the four subunits included in the color film unit are arranged into one 2×2 subunit matrix.

To make positions of the subunits in the color film units to which the subunits belong regular, so as to ensure that an image processing unit can subsequently perform efficient processing to obtain an image, in the color film layer, positions of all the color-determined subunits in the color film units to which the color-determined subunits belong are the same.

In one embodiment, the color film unit includes nine subunits, and the nine subunits include two color-determined subunits and seven transparent subunits. In an embodiment, the nine subunits included in the color film unit may be arranged into one 3×3 subunit matrix.

In one embodiment, the image sensor further includes a photodiode and a microlens, and the color film layer is disposed between the photodiode and the microlens.

In an embodiment of the application, a ratio of a quantity of transparent subunits to the total quantity of subunits in the color film unit is set to be greater than 1/2 in the image sensor. Because the transparent subunit does not filter light, and all light incident to the transparent subunit can be received by the photodiode, the light sensitivity of the image sensor can be effectively increased without increasing the area of the color film layer or increasing the size of the photodiode, thereby implementing miniaturization of the image sensor.

According to a second aspect, this application provides another image sensor. The image sensor includes a color film layer, the color film layer includes a plurality of color film units, the color film unit includes at least three color-determined subunits, a color of the color-determined subunit is determined, the color-determined subunit is configured to filter out portion of received light, a color of the portion of the received light is a complementary color of the color of the color-determined subunit, and a ratio of a quantity of the at least three color-determined subunits to a total quantity of subunits in the color film unit is greater than 1/2.

In one embodiment, the color film unit includes four subunits, the four subunits include three color-determined subunits and one transparent subunit, colors of the three color-determined subunits are cyan, yellow, and magenta, and the transparent subunit is configured to allow light to pass through.

In one embodiment, the color film unit includes four subunits, the four subunits include four color-determined subunits, colors of three of the four subunits are cyan, yellow, and magenta, and a color of the other one subunit is cyan, yellow, or magenta.

In an embodiment, the four subunits are arranged into one 2×2 subunit matrix.

In the another image sensor provided in an embodiment of the application, each color film unit includes at least three color-determined subunits, and a ratio of a quantity of color-determined subunits to the total quantity of subunits in the color film unit is greater than 1/2. Because the color-determined subunit can filter out light of a complementary color of a color of the color-determined subunit from light, and allow light of a color other than the complementary color of the subunit in the light to pass through, so that most of light incident to the color-determined subunit can be received by a photodiode, and light sensitivity of the image sensor can be effectively increased without increasing an area of the color film layer or increasing a size of the photodiode, thereby implementing miniaturization of the image sensor.

According to a third aspect, this application provides a camera device, including a compact camera module and an image processing unit. The compact camera module includes the image sensor according to the first aspect and the second aspect and a lens. The compact camera module is configured to capture an image, and the image processing unit is configured to process the image captured by the compact camera module.

Because the camera device includes the image sensor provided in the foregoing embodiments, the camera device can still collect a clear image with a relatively high luminance at night with relatively low light intensity. In addition, because a size of the image sensor does not need to be increased, a lens with a relatively large aperture does not need to be disposed, thereby implementing miniaturization of the camera device. Further, manufacturing costs of the camera device can be further reduced.

According to a fourth aspect, this application provides a surveillance system, including:
  a management center and at least one camera, where the camera includes the camera device according to the third aspect, and
  the management center is configured to manage the at least one camera.

In an embodiment, the camera is an internet protocol camera.

Because the camera in the surveillance system may be the camera device according to the third aspect, a clear image with a relatively high luminance can be collected at night, thereby improving surveillance efficiency of the surveillance system.

According to a fifth aspect, this application provides a method for obtaining image data from an image sensor. The image sensor includes a color film layer, the color film layer includes a plurality of color film units, the color film unit includes one original color-determined subunit and three transparent subunits, a color of the original color-determined subunit is determined, the original color-determined subunit is configured to filter out light of a color other than the color of the original color-determined subunit, the transparent subunit is configured to allow light to pass through, a first transparent subunit is a transparent subunit, in the color film layer, of which there is a color-determined subunit in four neighborhoods, and a second transparent subunit is a transparent subunit other than the first transparent subunit in the plurality of transparent subunits in the color film layer; and
  the method includes the following operations:
    performing update processing on the first transparent subunit based on both a luminance and colors of the first transparent subunit and luminances of two original color-determined subunits around the first transparent subunit, to obtain an initially-updated color-determined subunit having a first target color and a first target luminance, where the two original color-determined subunits have different colors, and one of the two original color-determined subunits is located in the four neighborhoods of the first transparent subunit and the other is located in diagonal neighborhoods or extension directions of eight neighborhoods of the first transparent subunit, or the two original color-determined subunits are both located in the four neighborhoods of the first transparent subunit;

performing update processing on the second transparent subunit based on both a luminance and colors of the second transparent subunit and luminances of two color-determined subunits located in diagonal neighborhoods of the second transparent subunit, to obtain a secondly-updated color-determined subunit having a second target color and a second target luminance, where the two color-determined subunits have different colors, and the two color-determined subunits are both the original color-determined subunits, or both are the initially-updated color-determined subunits, or one is the original color-determined subunit and the other is the initially-updated color-determined subunit; and obtaining the image data based on a color and a luminance of each original color-determined subunit in the color film layer, a color and a luminance of each initially-updated color-determined subunit, and a color and a luminance of each secondly-updated color-determined subunit.

In one embodiment, the operation of performing update processing on the first transparent subunit includes the following operations:

using, as the first target color, a color other than the colors of the two original color-determined subunits around the first transparent subunit in light passing through the first transparent subunit;

using, as the first target luminance, a difference between the luminance of the first transparent subunit and a sum of the luminances of the two original color-determined subunits around the first transparent subunit; and performing update processing on the first transparent subunit to obtain the initially-updated color-determined subunit, where a color of the initially-updated color-determined subunit is the first target color, and a luminance of the initially-updated color-determined subunit is the first target luminance.

In one embodiment, the operation of performing update processing on the second transparent subunit includes the following operations:

using, as the second target color, a color other than the colors of the two color-determined subunits located in the diagonal neighborhoods of the second transparent subunit in light passing through the second transparent subunit;

using, as the second target luminance, a difference between the luminance of the second transparent subunit and a sum of the luminances of the two color-determined subunits located in the diagonal neighborhoods of the second transparent subunit; and performing update processing on the second transparent subunit to obtain the secondly-updated color-determined subunit, where a color of the secondly-updated color-determined subunit is the second target color, and a luminance of the secondly-updated color-determined subunit is the second target luminance.

According to the method for obtaining image data from an image sensor provided in an embodiment of the application, update processing is performed on the first transparent subunit based on both the luminance and the color of the first transparent subunit and luminances of the original color-determined subunits, and then update processing is performed on the second transparent subunit based on both the luminance and the colors of the second transparent subunit and luminances of the two color-determined subunits, so that each subunit in the color film layer has a color and a luminance, to obtain the image data for image color reproduction. Because the transparent subunit that does not filter light is disposed in the color film layer, light sensitivity of the image sensor is increased. In addition, another color and a corresponding luminance that are required for image color reproduction may be further obtained based on both the luminance and the colors of the transparent subunit and luminances of the original color-determined subunits, thereby achieving an effect of accurate mage color reproduction.

According to a sixth aspect, this application provides a method for obtaining image data from an image sensor. The image sensor includes a color film layer, the color film layer includes a plurality of color film units, the color film unit includes one original color-determined subunit and three transparent subunits, a color of the original color-determined subunit is determined, the original color-determined subunit is configured to filter out light of a complementary color of the color of the original color-determined subunit, the transparent subunit is configured to allow light to pass through, a first transparent subunit is a transparent subunit, in the color film layer, of which there is an original color-determined subunit in four neighborhoods, and a second transparent subunit is a transparent subunit other than the first transparent subunit in the plurality of transparent subunits in the color film layer; and the method includes the following operations:

performing update processing on each original color-determined subunit to obtain an original color-specified subunit, where a color of the original color-specified subunit is a complementary color of a color of the corresponding original color-determined subunit, and a luminance of the original color-specified subunit is a difference between an average luminance value of transparent subunits in four neighborhoods of the corresponding original color-determined subunit and a luminance of the corresponding original color-determined subunit;

performing update processing on the first transparent subunit based on both the luminance and the colors of the first transparent subunit and luminances of two original color-specified subunits around the first transparent subunit, to obtain an initially-updated color-specified subunit having a first target color and a first target luminance, where the two original color-specified subunits have different colors, and one of the two original color-specified subunits is located in the four neighborhoods of the first transparent subunit and the other is located in diagonal neighborhoods or extension directions of eight neighborhoods of the first transparent subunit, or the two original color-specified subunits are both located in the four neighborhoods of the first transparent subunit;

performing update processing on the second transparent subunit based on both a luminance and colors of the second transparent subunit and luminances of two color-specified subunits located in diagonal neighborhoods of the second transparent subunit, to obtain a secondly-updated color-specified subunit having a second target color and a second target luminance, where the two color-specified subunits have different colors, and the two color-specified subunits are both the original color-specified subunits, or both are the initially-updated color-specified subunits, or one is the original color-specified subunit and the other is the initially-updated color-specified subunit; and obtaining the image data based on a color and a luminance of each original color-specified subunit in the color film layer, a color and a luminance of each initially-updated color-specified subunit, and a color and a luminance of each secondly-updated color-specified subunit.

With reference to the sixth aspect, in a first possible implementation, the operation of performing update processing on the first transparent subunit includes the following operations:

using, as the first target color, a color other than the colors of the two original color-specified subunits around the first transparent subunit in light passing through the first transparent subunit;

using, as the first target luminance, a difference between the luminance of the first transparent subunit and a sum of the luminances of the two original color-specified subunits around the first transparent subunit; and performing update processing on the first transparent subunit to obtain the initially-updated color-specified subunit, where a color of the initially-updated color-specified subunit is the first target color, and a luminance of the initially-updated color-specified subunit is the first target luminance.

In one embodiment, the operation of performing update processing on the second transparent subunit includes the following operations:

using, as the second target color, a color other than the colors of the two color-specified subunits located in the diagonal neighborhoods of the second transparent subunit in light passing through the second transparent subunit;

using, as the second target luminance, a difference between the luminance of the second transparent subunit and a sum of the luminances of the two color-specified subunits located in the diagonal neighborhoods of the second transparent subunit; and performing update processing on the second transparent subunit to obtain the secondly-updated color-specified subunit, where a color of the secondly-updated color-specified subunit is the second target color, and a luminance of the secondly-updated color-specified subunit is the second target luminance.

According to the method for obtaining image data from an image sensor provided in an embodiment of the application, a color and a luminance of each color-determined subunit are updated to a color and a luminance of an original color-specified subunit; update processing is performed on the first transparent subunit based on both the luminance and colors of the first transparent subunit and luminances of the original color-specified subunits; then update processing is performed on the second transparent subunit based on both the luminance and colors of the second transparent subunit and luminances of the two color-specified subunits, so that each subunit in the color film layer has a color and a luminance, to obtain the image data for image color reproduction. The transparent subunit that does not filter light is disposed in the color film layer, only the portion of the received light of the complementary color of the color of the color-determined subunit can be filtered out from the light, and light of two colors other than the complementary color can be received by the image sensor. Therefore, compared with an image sensor provided with an RGB color film layer in a related technology, this effectively increases light sensitivity of the image sensor. In addition, another color and a corresponding luminance that are required for image color reproduction may be further obtained based on the luminance of the transparent subunit and the luminance of the original color-specified subunit, thereby achieving an effect of accurate image color reproduction.

According to a seventh aspect, an apparatus for obtaining image data from an image sensor is provided, including a processor and an image sensor, where the processor is configured to perform, based on a luminance and a color of each subunit in the image sensor, the method according to any one of the fifth aspect or the possible implementations of the fifth aspect or any one of the sixth aspect or the possible implementations of the sixth aspect on the corresponding subunit in the image sensor, to obtain image data from the image sensor.

According to an eighth aspect, a computer-readable storage medium is provided. The computer-readable storage medium stores an instruction, and when the readable storage medium is run on a processing component, the processing component is enabled to perform the method for obtaining image data from an image sensor according to any one of the fifth aspect or the possible implementations of the fifth aspect or any one of the sixth aspect or the possible implementations of the sixth aspect.

According to a ninth aspect, a computer program product is provided. The computer program product stores an instruction, and when the computer program product is run on a computer, the computer is enabled to perform the method for obtaining image data from an image sensor according to any one of the fifth aspect or the possible implementations of the fifth aspect or any one of the sixth aspect or the possible implementations of the sixth aspect.

According to a tenth aspect, a chip is provided. The chip includes a programmable logic circuit and/or a program instruction, and when the chip is run, the chip is configured to implement the method for obtaining image data from an image sensor according to any one of the fifth aspect or the possible implementations of the fifth aspect or any one of the sixth aspect or the possible implementations of the sixth aspect.

In this application, the implementations provided in the foregoing aspects can be further combined to provide more implementations.

BRIEF DESCRIPTION OF DRAWINGS

FIG. 34 is a schematic diagram of a color film layer obtained after a first transparent subunit is updated according to an embodiment of this application;

FIG. 35 is a schematic diagram of a color film layer obtained after a second transparent subunit is updated based on the color film layer shown in FIG. 34 according to an embodiment of this application;

DESCRIPTION OF EMBODIMENTS

To make objectives, technical solutions, and advantages of this application clearer, the following further describes implementations of this application in detail with reference to the accompanying drawings.

Figure 1:
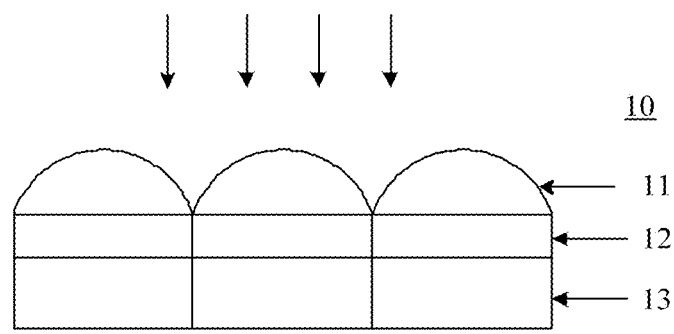
FIG. 1 is a partial cross-sectional structure view of an image sensor.

FIG. 1 is a partial cross-sectional structure view of an image sensor. An image sensor 10 includes a microlens (which is also referred to as a microlens or a microlens array, or the like) 11, a color film layer (which is also referred to as a color filter, a color film filter, a color film filter array, or the like) 12, and a photodiode 13. The microlens 11 may be configured to converge light to increase an amount of light and a signal strength of light incident to the color film layer 12. The light is incident to the color film layer 12 after being converged by the microlens 11, the color film layer 12 filters the converged light, and the photodiode 13 receives light obtained after filtering. Currently, the image sensor has been widely applied to a camera device such as a camera or a video camera. The camera device may be a camera device disposed in a surveillance system.

Whether the camera device can collect a clear image with a relatively high luminance depends on light sensitivity of the image sensor in the camera device, that is, depends on an amount of light received by the photodiode in the image sensor. According to statistics, more than 80% of criminal cases occur at night, and it is difficult for a camera device in a security protection system to collect images at night used for effectively solving cases, because light intensity at night is very low. Therefore, a biggest challenge for the camera device disposed in the security protection system is to accurately recognize a facial feature, a skin color, a clothing color, license plate information, a vehicle color, and the like at night. In a related technology, a manner such as increasing an area of a color film layer to increase a size of a photodiode is used to increase light sensitivity of an image sensor, so as to ensure that more light can be transmitted to the photodiode. However, in a case of given resolution of the image sensor, a size of the image sensor is increased by using the method in the related technology, and consequently, miniaturization of the image sensor cannot be implemented. In addition, because a size of a lens disposed in the camera device is related to the size of the image sensor, a larger size of the image sensor indicates a larger aperture of a matched lens, and the size of the lens also needs to be increased accordingly, resulting in an increase in a size of the camera device. Consequently, miniaturization of the camera device cannot be implemented.

Figure 2:
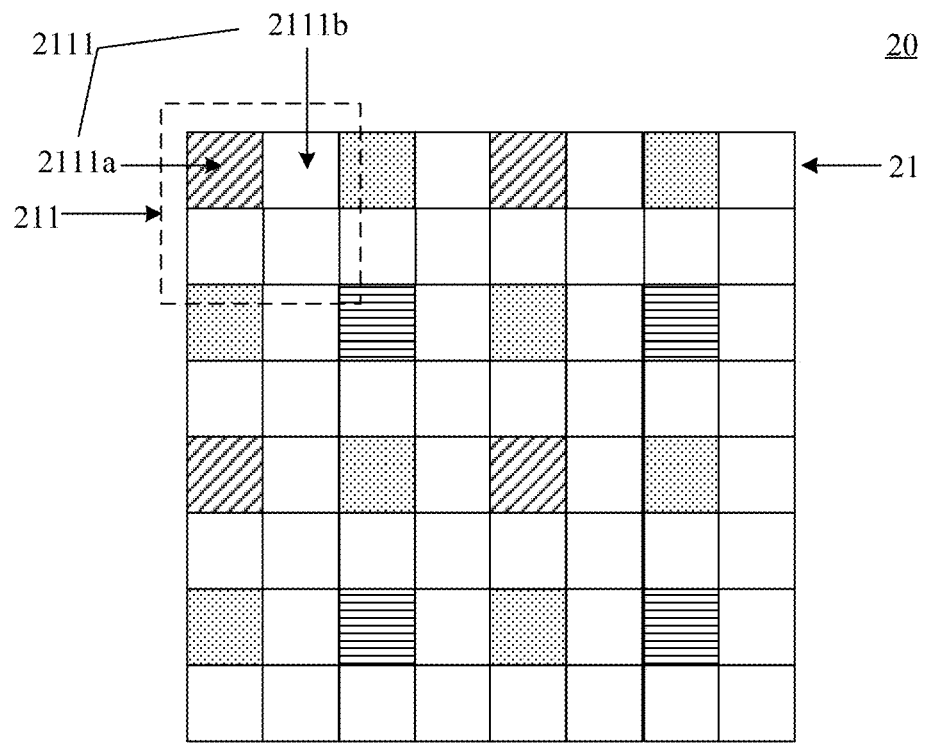
FIG. 2 is a schematic diagram of an image sensor according to an embodiment of this application.
Figure 3:
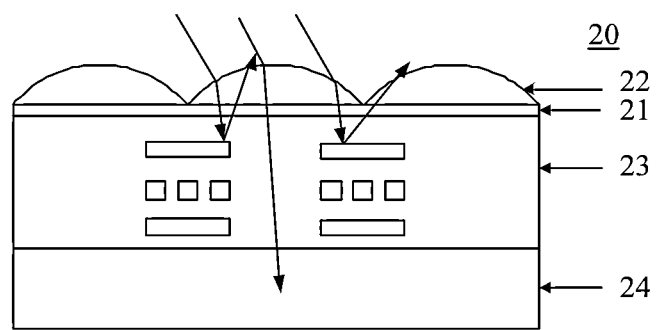
FIG. 3 is a schematic partial cross-sectional view of an image sensor according to an embodiment of this application.
Figure 4:
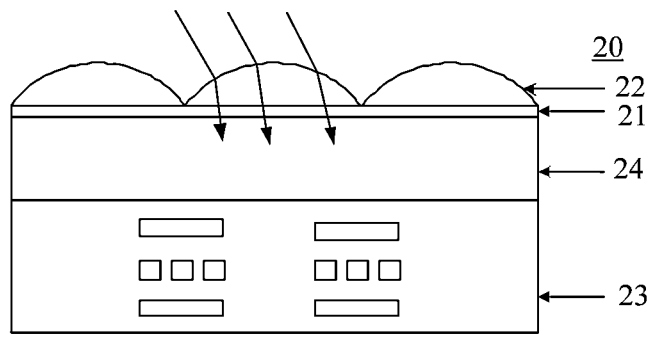
FIG. 4 is a schematic partial cross-sectional view of another image sensor according to an embodiment of this application.

Refer to FIG. 2, FIG. 3, and FIG. 4. FIG. 2 shows an image sensor 20 according to an embodiment of this application. FIG. 3 and FIG. 4 are two schematic cross-sectional structure views of the image sensor 20. The image sensor includes structures such as a color film layer 21, a photodiode 24, and a microlens 22. The color film layer 21 is disposed between the photodiode 24 and the microlens 22. The color film layer 21 may be made by mixing various organic or inorganic pigments in a transparent organic resin material. The microlens may be a microlens with a diameter of approximately 3 micrometers (μm).

It should be noted that the image sensor provided in the embodiments of this application may be a CCD image sensor including a charge-coupled device (CCD) or a CMOS image sensor including a complementary metal oxide semiconductor (CMOS). A structure of the image sensor may be a front-illuminated structure (which is also referred to as a surface-illuminated structure) or a back-illuminated structure. FIG. 3 is schematic partial cross-sectional view of a front-illuminated image sensor. In such a front-illuminated image sensor, after light passes through the microlens 22 and the color film layer 21, the light first passes through a wiring layer (including a metal circuit) 23 and then is incident to the photodiode 24. FIG. 4 is a schematic partial cross-sectional view of a back-illuminated image sensor. In such a back-illuminated image sensor, light may be directly incident to the photodiode 24 after passing through the microlens 22 and the color film layer 21. In the image sensor with the back-illuminated structure, the light can be directly incident to the photodiode, and an amount of light entering the photodiode 24 is not affected by the wiring layer. Therefore, the image sensor with the back-illuminated structure has relatively high light sensitivity.

Still referring to FIG. 2, the color film layer 21 may include a plurality of color film units 211, and the color film unit 211 includes a plurality of subunits 2111. The plurality of subunits 2111 may include at least one color-determined subunit 2111a and at least three transparent subunits 2111b. A color of the color-determined subunit is determined. Generally, the color of the color-determined subunit is single and determined, and this depends on a manufacturing material of the subunit. In other words, the color of the color-determined subunit is determined by a hardware material of the subunit and is an inherent attribute of the color-determined subunit, and the determined color is fixed and unchanged. When the at least one color-determined subunit 2111a includes at least two color-determined subunits 2111a, colors corresponding to the at least two color-determined subunits 2111a may be the same or may be different. FIG. 2 is described by using the following case as an example. The subunit 211 includes one color-determined subunit 2111a and three transparent subunits 2111b, and the four subunits are arranged into one 2×2 subunit matrix. Certainly, in actual implementation of the embodiments of this application, the plurality of subunits may be alternatively arranged in a shape of another subunit matrix. In the embodiments of this application, a 2×2 subunit matrix is used as an example for description.

The color-determined subunit 2111a is configured to filter out portion of received light, and the transparent subunit 2111b is configured to allow light to pass through. The transparent subunit 2111b does not need to filter light, and can allow all light incident to the transparent subunit 2111b to pass through. Therefore, this can ensure that the photodiode receives more light, thereby increasing light sensitivity of the image sensor. However, to ensure that light sensitivity of the image sensor can be effectively increased, a ratio of a quantity of the at least one color-determined subunit to a quantity of the plurality of subunits is less than 1/2. In other words, a ratio of a quantity of at least one color-determined subunit in each color film unit to a total quantity of subunits in the color film unit is less than 1/2, that is, a ratio of a total quantity of color-determined subunits in the color film layer to a total quantity of subunits in the color film layer is less than 1/2. For example, when a quantity of a plurality of subunits in the color film unit is 9, a quantity of disposed color-determined subunits should be less than 4.5, that is, one, two, three, or four color-determined subunits may be disposed in the color film unit. Correspondingly, a quantity of transparent subunits disposed in the color film unit should be greater than 4.5, that is, five, six, seven, or eight transparent subunits may be disposed in the color film unit.

Figure 5:
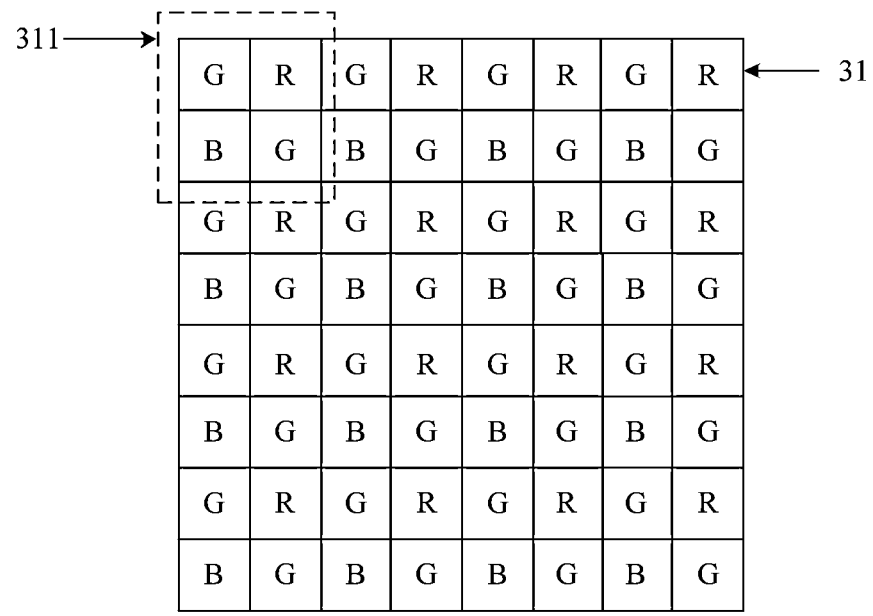
FIG. 5 is a schematic diagram of a color film layer according to a related technology.

In a related technology, a relatively common color film layer includes a red (R) subunit, a green (G) subunit, and a blue (B) subunit. The color film layer may be referred to as an RGB color film layer for short, and colors of the red subunit, the green subunit, and the blue subunit respectively correspond to three primary optical colors: red, green, and blue. Further, an arrangement pattern of subunits in the RGB color film layer is usually set according to a Bayer array. As shown in FIG. 5, one red subunit R, one blue subunit B, and two green subunits G constitute one color film unit 311, and a plurality of color film units 311 are array-based arranged to constitute the RGB color film layer 31. In the RGB color film layer 31, because a subunit of each color allows only light of the color of the subunit to pass through, and light of another color is reflected or absorbed by the subunit, some of light incident to the subunit is lost and cannot be received by the photodiode. For example, the red subunit allows only red light in light to pass through, and absorbs or reflects light of another color. In other words, at least 2/3 light incident to the red subunit are lost, and a photodiode corresponding to the red subunit can receive only the red light in the incident light.

However, the transparent subunit is introduced into the image sensor provided in this application. Because the transparent subunit does not filter light, and all light incident to the transparent subunit can be received by the photodiode, light sensitivity of the image sensor can be increased without increasing an area of the color film layer or increasing a size of the photodiode, thereby implementing miniaturization of the image sensor. In addition, the ratio of the quantity of the at least one color-determined subunit to the quantity of the plurality of subunits is controlled to be less than 1/2, thereby ensuring effectiveness of increasing light sensitivity of the image sensor.

In an embodiment of this application, the color film unit includes four subunits, and the four subunits may include one color-determined subunit and three transparent subunits (for example, the case shown in FIG. 2). In an embodiment, the four subunits may be arranged into one 2×2 subunit matrix.

In another embodiment of this application, the color film unit may include nine subunits, and the nine subunits may include two color-determined units and seven transparent color film units. In an embodiment, the nine subunits may be arranged into one 3×3 subunit matrix.

In an embodiment of the application, an example in which the color film unit includes four subunits, and the four subunits are arranged into one 2×2 subunit matrix is used for description. When the color film unit includes another quantity of subunits, reference may be made to related descriptions in an embodiment of the application.

In actual implementation of an embodiment of the application, a plurality of types of color film layers may be used. In addition to the type such as the foregoing described RGB color film layer, the color film layer may further include a type such as a complementary color film layer. Complementary colors are colors complementary to the three primary optical colors. For example, a cyan color and a red color are colors complementary to each other, a yellow color and a blue color are colors complementary to each other, and a magenta color and a green color are colors complementary to each other. The complementary color film layer means that each color-determined subunit in the color film layer has a complementary color. For example, the complementary color film layer is a color film layer including a cyan (C) subunit, a magenta (M) subunit, and a yellow (Y) subunit, and may be referred to as a CMY color film layer. The subunit in the complementary color film layer may absorb or reflect light of a complementary color of the color of the subunit, and allow light of another color to pass through. For example, for the cyan subunit, a color of the cyan subunit is cyan, and a complementary color is red. In this case, the cyan subunit may allow green light and blue light in light to pass through, and absorb or reflect red light. Certainly, in actual implementation of an embodiment of the application, another type of color film layer may be alternatively used, in addition to the foregoing RGB color film layer and CMY color film layer.

Based on different types of color film layers, the embodiments of this application may provide a plurality of types of image sensors. In the embodiments of this application, an example in which the types of the color film layers are the RGB color film layer and the CMY color film layer is used for description.

In a first-type image sensor, if the color film layer included in the image sensor is the RGB color film layer, a color-determined subunit may be configured to filter out, from received light, light of a color other than a color of the color-determined subunit, and the color of the color-determined subunit is the color of the color-determined subunit. The color film layer includes a plurality of color film units, and a form of the color film layer depends on a combination manner of the plurality of color film units. For example, four color film units arranged in a matrix form may be used as a minimum combination unit, the minimum combination units are array-based arranged to obtain a color film layer, and the four color film units include at least three color film units that are different from each other. Alternatively, four color film units arranged in a strip form may be used as a minimum combination unit, the minimum combination units are array-based arranged to obtain a color film layer, and the four color film units include at least three color film units that are different from each other. Alternatively, two color film units that are arranged in a strip shape and that are different from each other may be used as a minimum combination unit, and the minimum combination units are array-based arranged to obtain a color film layer. Certainly, one or three color film units may be alternatively arranged as a minimum combination unit, and the minimum combination units are array-based arranged to obtain a color film layer. In an embodiment of the application, an example in which it may be set that four color film units arranged in a matrix form are used as a minimum combination unit and two color film units arranged in a strip form are used as a minimum combination unit is used for description.

In a first-type combination manner of the color film unit, four color film units arranged in a matrix form are used as a minimum combination unit, and the minimum combination units are array-based arranged to obtain a color film layer.

In every four color film units arranged in a matrix form of the color film layer, color-determined subunits of three color film units are red, green, and blue, and a color-determined subunit of the one color film unit is red, green, or blue.

For example, every four color film units arranged in a matrix form may have the following three combination manners: Color-determined subunits of the four color film units are red, green, blue, and red; color-determined subunits of the four color film units are red, green, blue, and green; and color-determined subunits of the four color film units are red, green, blue, and blue.

In the color film layer, positions of the color-determined subunits in the color film units to which the subunits belong may be the same or may be different. To ensure that an image processing unit can subsequently perform efficient processing to obtain an image, in the color film layer, the positions of all the color-determined subunits in the color film units to which the subunits belong may be the same. In this way, the positions of the color-determined subunits in the color film units to which the subunits belong are regular, and this helps the image processing unit subsequently perform processing to obtain the image.

Figure 6:
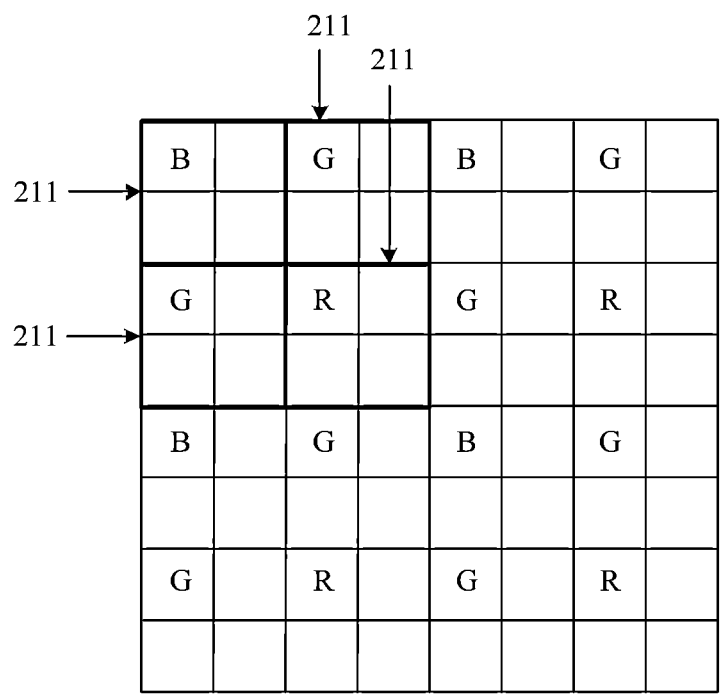
FIG. 6 is a schematic diagram of a color film layer according to an embodiment of this application.

For example, as shown in FIG. 6, because human eyes are relatively sensitive to green, to enable the image sensor to accurately simulate sensitivity of human eyes to light of different colors, in every four color film units 211 shown in FIG. 6, green G color-determined subunits of two color film units 211 may be disposed. In other words, in every four color film units 211 arranged in a matrix form in the color film layer, colors of the color-determined subunits are blue B, green G, red R, and green G. To ensure that the color-determined subunits can be evenly distributed in the color film layer, the color film units each including the green G color-determined subunit may be diagonally located in the four color film units. In FIG. 6, the positions of all the color-determined subunits in the color film units to which the color-determined subunits belong are the same, and all the color-determined subunits are located in upper-left corners of the color film units 211.

Figure 7:
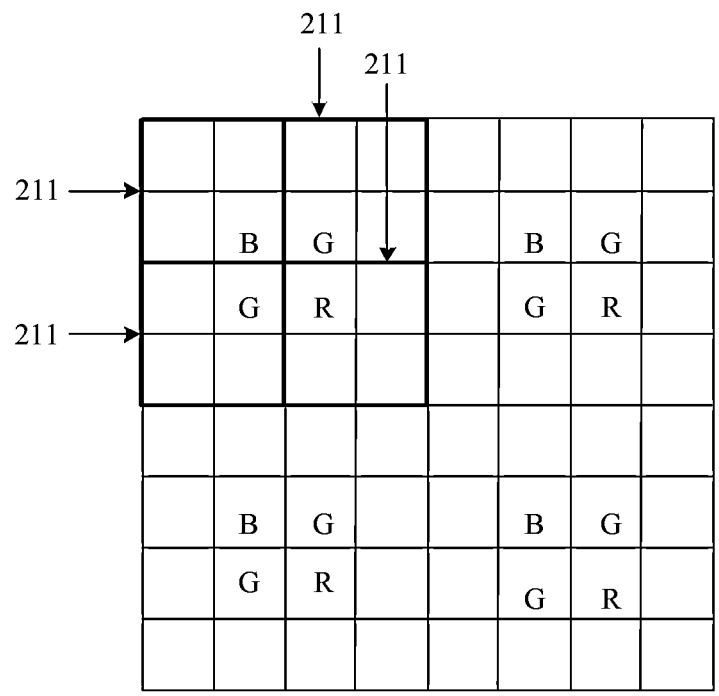
FIG. 7 is a schematic diagram of another color film layer according to an embodiment of this application.

Certainly, the positions of the color-determined subunits in the color film units to which the color-determined subunits belong may be different. As shown in FIG. 7, in each minimum combination unit constituted by four color film units arranged in a matrix form, four color-determined subunits are all distributed around a center of the minimum combination unit. In this way, in each minimum combination unit, colors are centrally distributed, so that efficiency of subsequently collecting image data can be improved.

In a second-type combination manner of the color film unit, two color film units arranged in a strip form are used as a minimum combination unit, and the minimum combination units are array-based arranged to obtain a color film layer.

Because a color corresponding to the color-determined subunit is the color of the color-determined subunit, that is, red, blue, or green, the second-type arrangement pattern of the color film unit includes the following three forms.

Figure 8:
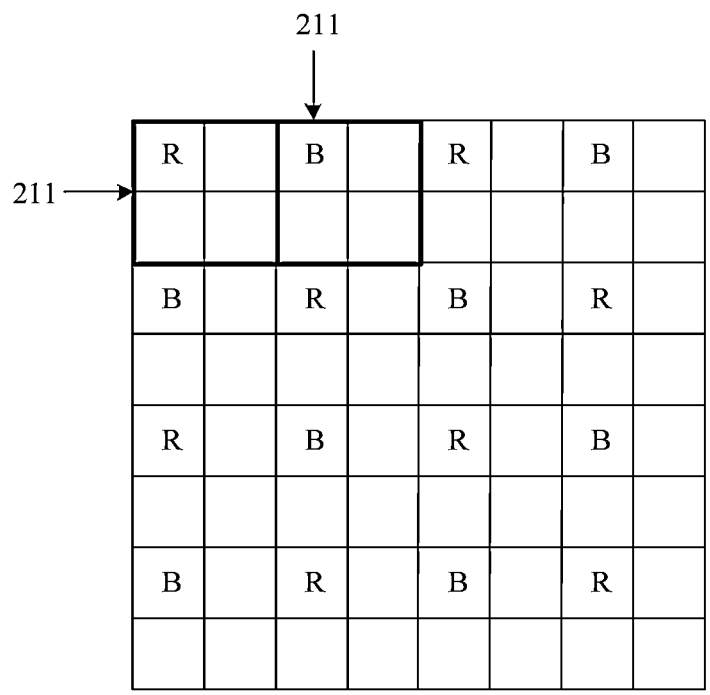
FIG. 8 is a schematic diagram of still another color film layer according to an embodiment of this application.

In a first form, as shown in FIG. 8, in every two adjacent color film units 211 in the color film layer, color-determined subunits are red R and blue B.

Figure 9:
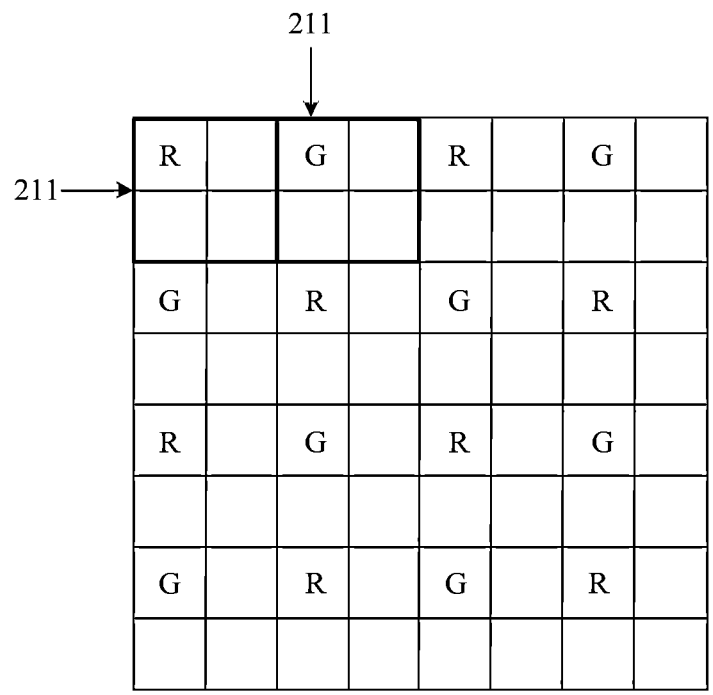
FIG. 9 is a schematic diagram of yet another color film layer according to an embodiment of this application.

In a second form, as shown in FIG. 9, in every two adjacent color film units 211 in the color film layer, color-determined subunits are red R and green G.

Figure 10:
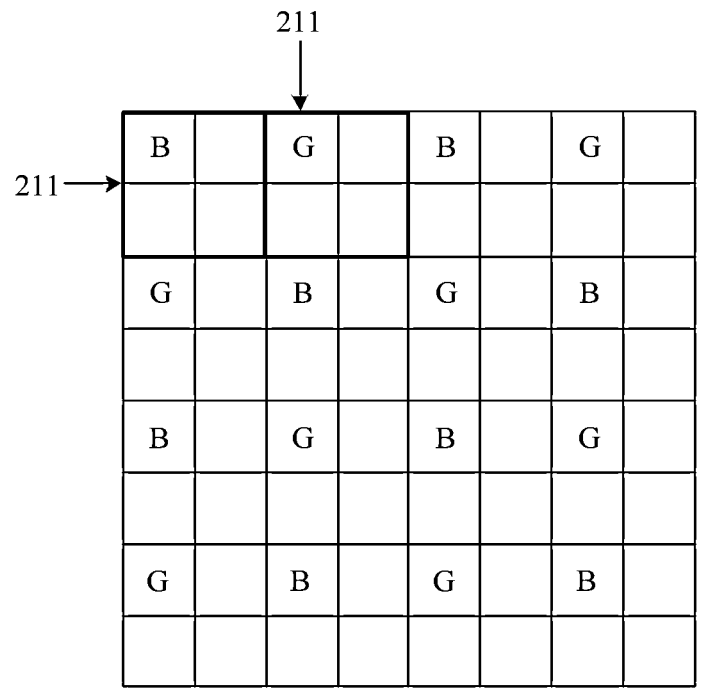
FIG. 10 is a schematic diagram of still yet another color film layer according to an embodiment of this application.

In a third form, as shown in FIG. 10, in every two adjacent color film units 211 in the color film layer, color-determined subunits are blue B and green G.

In the foregoing three forms, when the minimum combination units are array-based arranged to obtain the color film layer, color-determined subunits in any two adjacent color film units are different in a first direction of the color film layer, where the first direction is a row direction and/or a column direction. In this way, color-determined subunits of different colors are evenly distributed in the color film layer, to achieve a uniform light effect and facilitate image processing subsequently performed by the image processing unit.

For example, as shown in FIG. 8 to FIG. 10, in FIG. 8, the red R subunits and the blue B subunits are alternately arranged at intervals in the row direction and/or the column direction, so that for any one color film unit 211 having a blue B subunit, color-determined subunits in adjacent color film units 211 in a row direction and/or a column direction of the color film units 211 all are red R. Similarly, in FIG. 9, the red R subunits and the green G subunits are alternately arranged at intervals in the row direction and/or the column direction. Similarly, in FIG. 10, the blue B subunits and the green G subunits are alternately arranged at intervals in the row direction and/or the column direction.

Actually, the manner of alternately arranging two color film units at intervals shown in FIG. 8 to FIG. 10 may be alternatively considered as repeated arrangement for four color film units arranged in a matrix form. Details are not described in an embodiment of the application.

Figure 11:
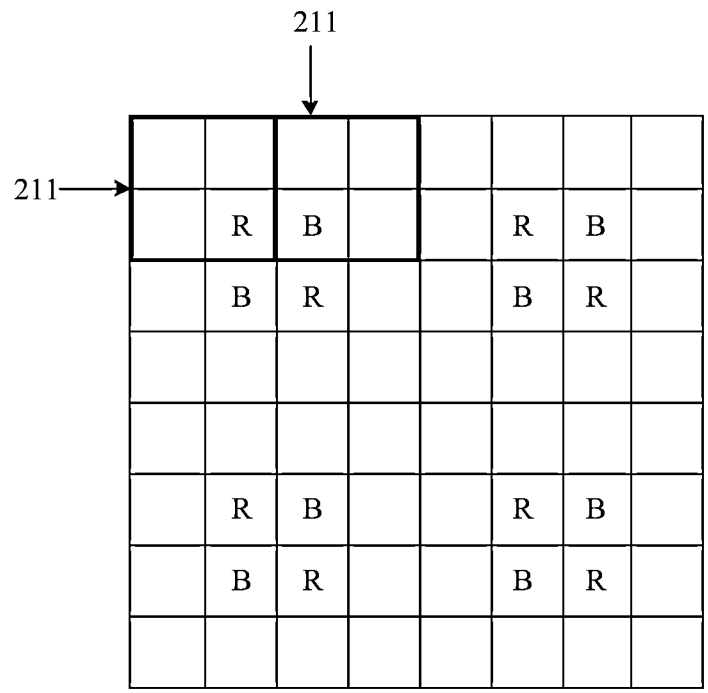
FIG. 11 is a schematic diagram of a further color film layer according to an embodiment of this application.
Figure 12:
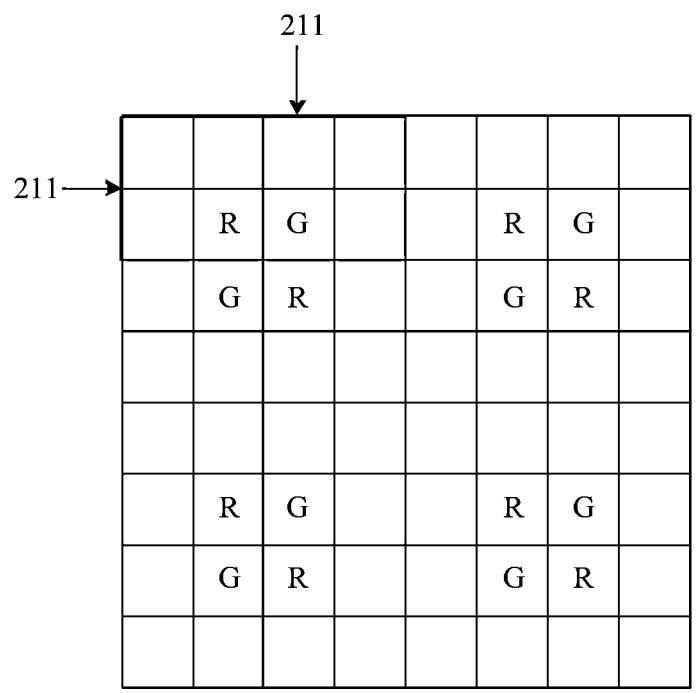
FIG. 12 is a schematic diagram of a further color film layer according to an embodiment of this application.
Figure 13:
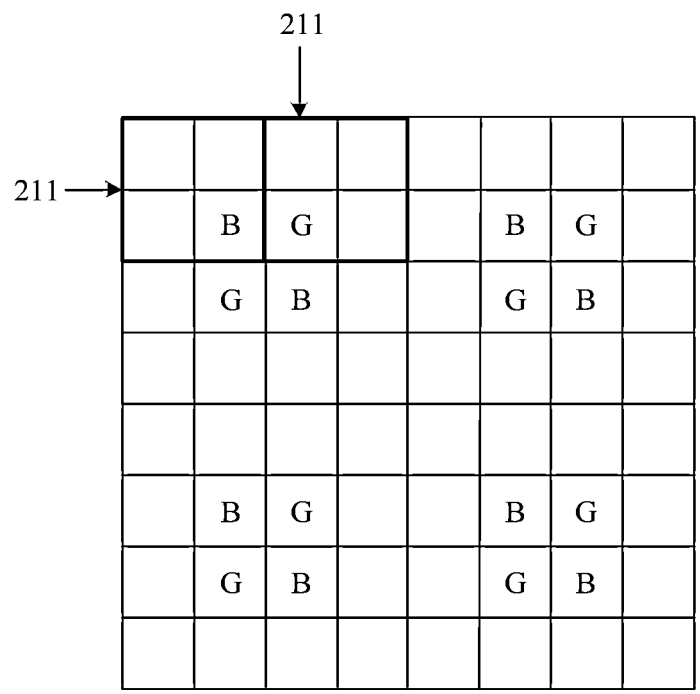
FIG. 13 is a schematic diagram of a further color film layer according to an embodiment of this application.

It should be noted that, in FIG. 8 to FIG. 10, the positions of all the color-determined subunits in the color film units to which the color-determined subunits belong are the same, and all the color-determined subunits are located in upper-left corners of the color film units 211. Certainly, the color-determined subunits may be alternatively located in other positions of the color film units to which the color-determined subunits belong. In cases shown in FIG. 11 to FIG. 13, FIG. 11 is used to describe another arrangement pattern of the color film layer corresponding to the first form, FIG. 12 is used to describe another arrangement pattern of the color film layer corresponding to the second form, and FIG. 12 is used to describe another arrangement pattern of the color film layer corresponding to the third form. In FIG. 11 to FIG. 13, in any four color film units 211 arranged in a matrix form, color-determined subunits are located in lower-right corners, lower-left corners, upper-right corners, and upper-left corners of the four color film units.

In the first-type image sensor, a percentage of a quantity of transparent subunits to a quantity of all subunits is at least 75%. This ensures that light is received by the photodiode in the image sensor as much as possible, and effectively increases light sensitivity of the image sensor.

In a second-type image sensor, if the color film layer included in the image sensor is the CMY color film layer, a color corresponding to a color-determined subunit is a complementary color of the color of the color-determined subunit. The color-determined subunit can be configured to filter out, from received light, light of the complementary color of the color of the color-determined subunit, where the color of the color-determined subunit is the color of the color-determined subunit. Similar to the first-type image sensor, a form of the color film layer depends on a combination manner of the plurality of color film units. In the second-type image sensor, in an embodiment of the application, the following example is used for description: Four color film units arranged in a matrix form are used as a minimum combination unit, and the minimum combination units are array-based arranged to obtain a color film layer; and two color film units arranged in a strip form are used as a minimum combination unit, and the minimum combination units are array-based arranged to obtain a color film layer.

In a first-type combination manner of the color film unit, four color film units arranged in a matrix form are used as a minimum combination unit, and the minimum combination units are array-based arranged to obtain a color film layer.

In every four color film units arranged in a matrix form of the color film layer, colors of the color-determined subunits of three color film units are cyan, yellow, and magenta, and a color-determined subunit of the one color film unit is cyan, yellow, or magenta.

For example, every four color film units arranged in a matrix form may have the following three combination manners: color-determined subunits of the four color film units are cyan, magenta, yellow, and cyan; color-determined subunits of the four color film units are cyan, magenta, yellow, and magenta; and color-determined subunits of the four color film units are cyan, magenta, yellow, and yellow.

In the color film layer, positions of the color-determined subunits in the color film units to which the subunits belong may be the same or may be different. To ensure that an image processing unit can subsequently perform efficient processing to obtain an image, in the color film layer, the positions of all the color-determined subunits in the color film units to which the subunits belong may be the same. In this way, the positions of the color-determined subunits in the color film units to which the subunits belong are regular, and this helps the image processing unit subsequently perform processing to obtain the image.

Figure 14:
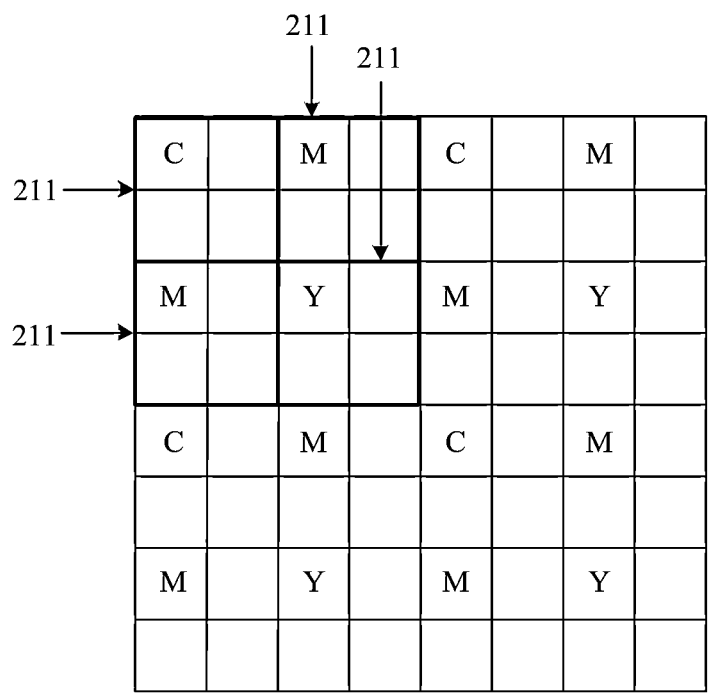
FIG. 14 is a schematic diagram of a further color film layer according to an embodiment of this application.

For example, as shown in FIG. 14, in four color film units 211 shown in FIG. 14, colors of color-determined subunits of two color film units may be set to a complementary color (that is, magenta M) of green. In other words, in every four color film units arranged in a matrix form in the color film layer, color-determined subunits are cyan C, magenta M, yellow Y, and magenta M. To ensure that the color-determined subunits can be evenly distributed in the color film layer, the color film units each including the magenta M color-determined subunit may be diagonally located in the four color film units. In FIG. 14, the positions of all the color-determined subunits in the color film units to which the color-determined subunits belong are the same, and all the color-determined subunits are located in upper-left corners of the color film units 211.

Figure 15:
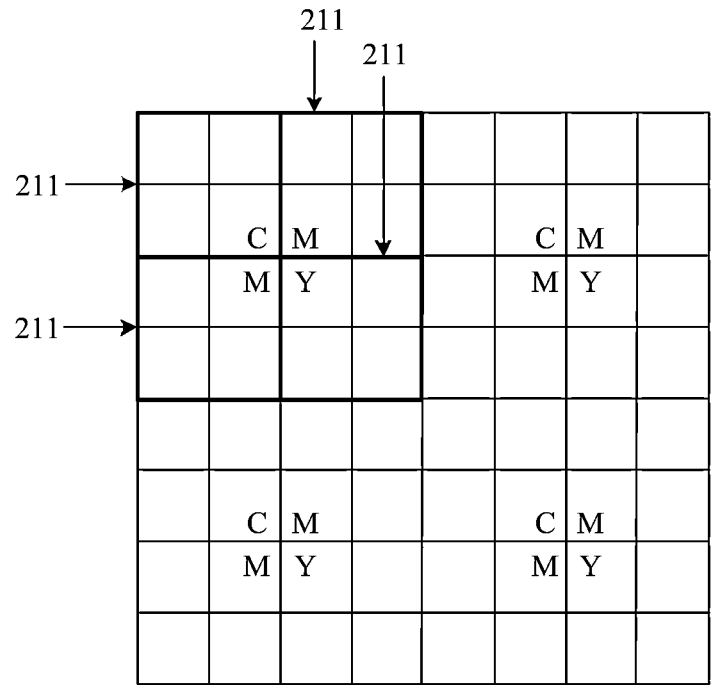
FIG. 15 is a schematic diagram of a further color film layer according to an embodiment of this application.

Certainly, the positions of the color-determined subunits in the color film units to which the color-determined subunits belong may be different. As shown in FIG. 15, in each minimum combination unit constituted by four color film units arranged in a matrix form, four color-determined subunits are all distributed around a center of the minimum combination unit.

In a second-type combination manner of the color film unit, two color film units arranged in a strip form are used as a minimum combination unit, and the minimum combination units are array-based arranged to obtain a color film layer. Because the color-determined subunit is cyan, magenta, or yellow, the second-type arrangement pattern of the color film unit includes the following three forms.

Figure 16:
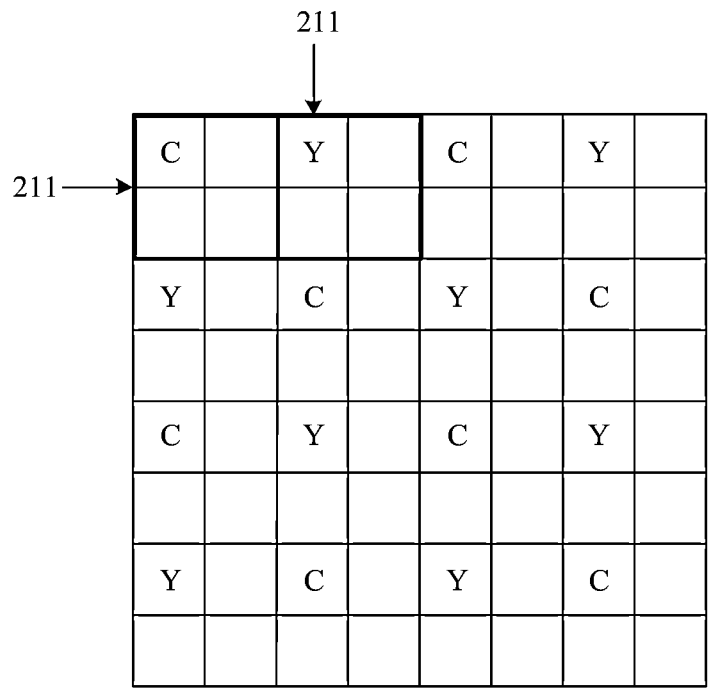
FIG. 16 is a schematic diagram of a further color film layer according to an embodiment of this application.

In a first form, as shown in FIG. 16, in every two adjacent color film units 211 in the color film layer, color-determined subunits are cyan C and yellow Y.

Figure 17:
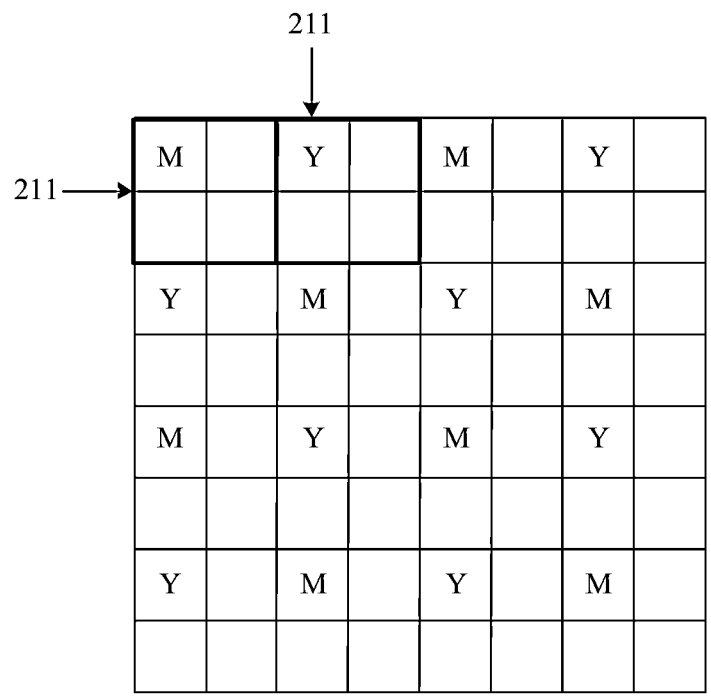
FIG. 17 is a schematic diagram of a further color film layer according to an embodiment of this application.

In a second form, as shown in FIG. 17, in every two adjacent color film units 211 in the color film layer, color-determined subunits are magenta M and yellow Y.

Figure 18:
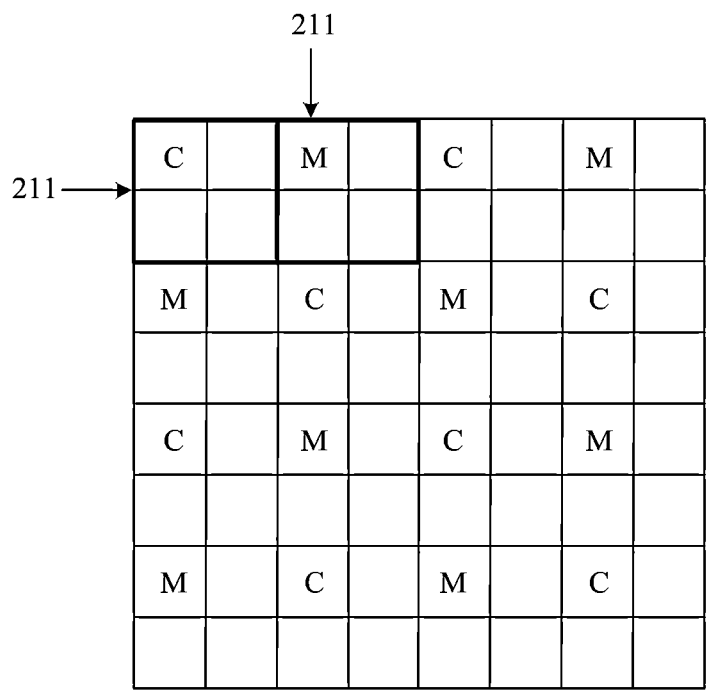
FIG. 18 is a schematic diagram of a further color film layer according to an embodiment of this application.

In a third form, as shown in FIG. 18, in every two adjacent color film units 211 in the color film layer, color-determined subunits are cyan C and magenta M.

Similar to the combination manner of the second-type color film unit described in the foregoing first-type image sensor, in the foregoing three forms, when the minimum combination units are array-based arranged to obtain the color film layer, color-determined subunits in any two adjacent color film units are different in a first direction of the color film layer, where the first direction is a row direction and/or a column direction. In this way, color-determined subunits of different colors are evenly distributed in the color film layer, to achieve a uniform light effect and facilitate image processing subsequently performed by the image processing unit.

For example, as shown in FIG. 16 to FIG. 18, in FIG. 16, the cyan C subunits and the yellow Y subunits are alternately arranged at intervals in the row direction and/or the column direction, so that for any one color film unit 211 having a yellow Y subunit, color-determined subunits in adjacent color film units 211 in a row direction and/or a column direction of the color film units 211 all are cyan C. Similarly, in FIG. 17, the magenta M subunits and the yellow Y subunits are alternately arranged at intervals in the row direction and/or the column direction. Similarly, in FIG. 18, the cyan C subunits and the magenta M subunits are alternately arranged at intervals in the row direction and/or the column direction.

The manner of alternately arranging two color film units at intervals shown in FIG. 16 to FIG. 18 may be alternatively considered as repeated arrangement for four color film units arranged in a matrix form. Details are not described in an embodiment of the application.

Figure 19:
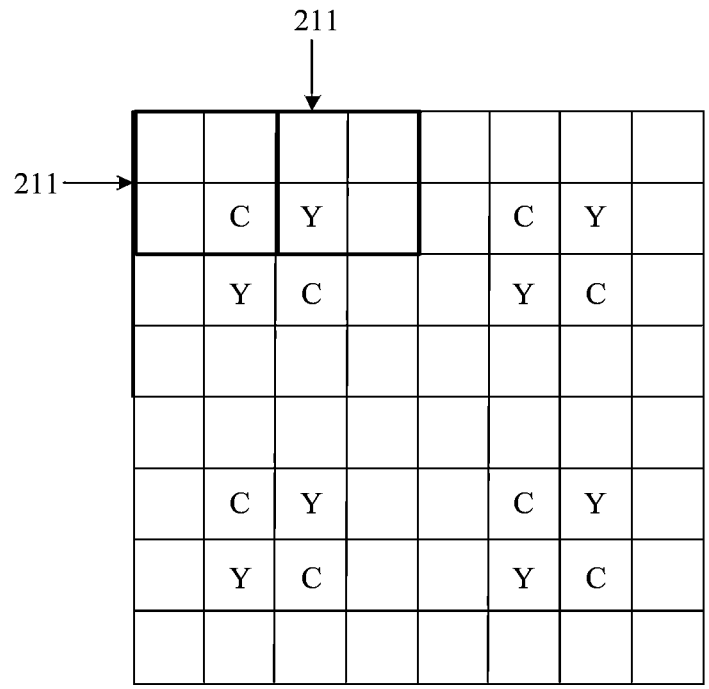
FIG. 19 is a schematic diagram of a further color film layer according to an embodiment of this application.
Figure 20:
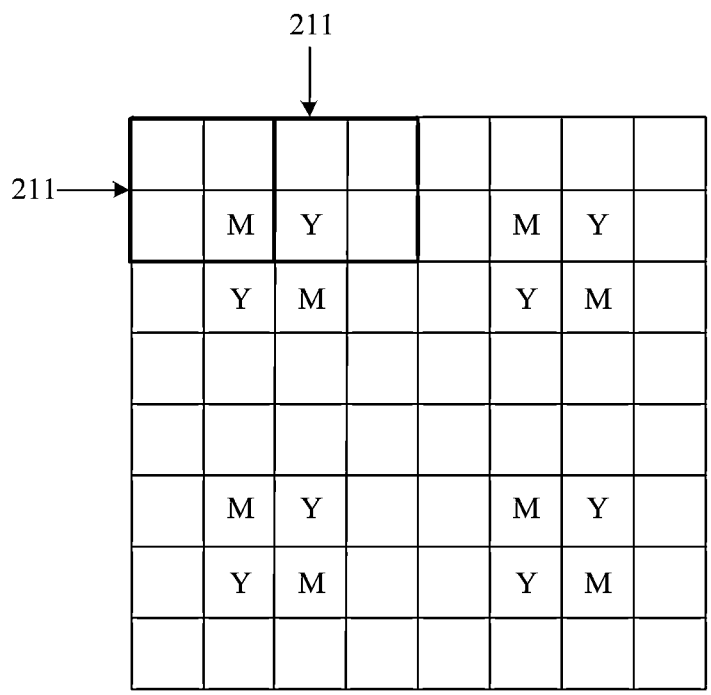
FIG. 20 is a schematic diagram of a further color film layer according to an embodiment of this application.
Figure 21:
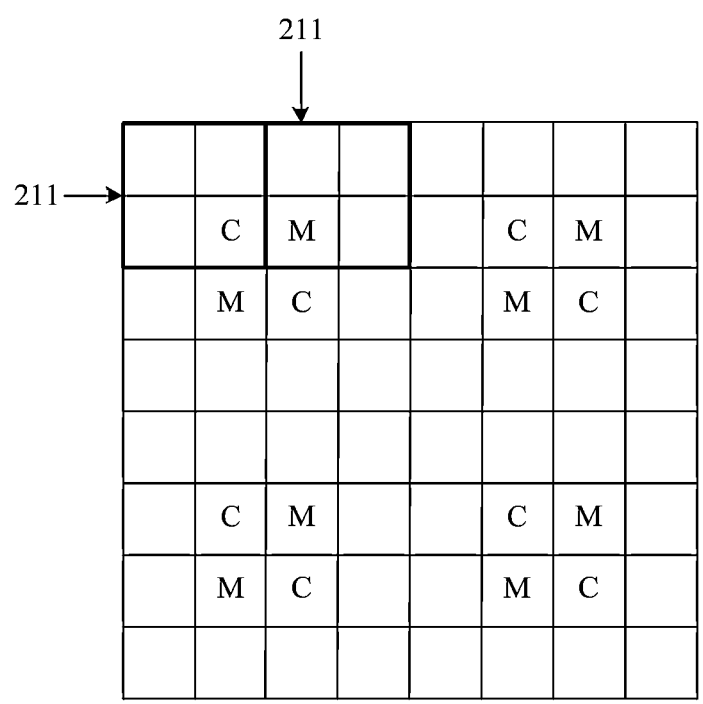
FIG. 21 is a schematic diagram of a further color film layer according to an embodiment of this application.

It should be noted that, in FIG. 16 to FIG. 18, the positions of all the color-determined subunits in the color film units to which the color-determined subunits belong are the same, and all the color-determined subunits are located in upper-left corners of the color film units 211. Certainly, the color-determined subunits may be alternatively located in other positions of the color film units to which the color-determined subunits belong. As shown in FIG. 19 to FIG. 21, FIG. 19 shows another arrangement pattern of the color film layer corresponding to the first form, FIG. 20 shows another arrangement pattern of the color film layer corresponding to the second form, and FIG. 21 shows another arrangement pattern of the color film layer corresponding to the third form. In FIG. 19 to FIG. 21, in any four color film units 211 arranged in a matrix form, color-determined subunits are located in lower-right corners, lower-left corners, upper-right corners, and upper-left corners of the four color film units.

It should be noted that, in the second-type image sensor, a percentage of a quantity of transparent subunits to a quantity of all subunits is at least 75%. This ensures that light is received by the photodiode in the image sensor as much as possible, and effectively increases light sensitivity of the image sensor. In addition, because the color film layer is the CMY color film layer, a difference from the RGB color film layer lies in that, a photodiode corresponding to each color-determined subunit in the CMY color film layer can receive more light. For example, for the cyan subunit in the CMY color film layer, the cyan subunit can allow green light and blue light in light to pass through, and absorb and reflect red light. In other words, a photodiode corresponding to the cyan subunit can receive the green light and the blue light. Therefore, light sensitivity of the image sensor is further increased. According to statistics, compared with a conventional image sensor using the RGB color film layer, the image sensor using the CMY color film layer can increase sensitivity by more than 80%, and this implements comparatively strong image obtaining and recognition capabilities of the image sensor in relatively low light intensity.

In conclusion, the color film layer included in the image sensor provided in an embodiment of the application includes a plurality of color film units, each color film unit includes a color-determined subunit and a transparent subunit, and a ratio of a quantity of color-determined subunits to a quantity of the plurality of subunits is less than 1/2. Because the transparent subunit does not filter light, and all light incident to the transparent subunit can be received by the photodiode, the light sensitivity of the image sensor can be effectively increased without increasing the area of the color film layer or increasing the size of the photodiode, thereby implementing miniaturization of the image sensor.

It should be noted that, in the first-type image sensor and the second-type image sensor, light incident to the image sensor may include visible ambient light and near-infrared light emitted by a near-infrared light source.

For the RGB color film layer, when the light incident to the image sensor includes only visible light in ambient light, the color-determined subunit may allow only light of a color of the color-determined subunit to pass through, and absorb or reflect light of another color; or when the light incident to the image sensor includes visible light in ambient light and near-infrared light emitted by a near-infrared light source, the color-determined subunit may allow only light of a color of the color-determined subunit to pass through, and absorb or reflect light of another color and the near-infrared light. A transparent color film may transmit the visible light and the near-infrared light.

For the CMY color film layer, when the light incident to the image sensor includes only visible light in ambient light, the color-determined subunit may allow light of a color other than a complementary color of the color-determined subunit in the visible light to pass through, and reflect or absorb light corresponding to the complementary color of the color-determined subunit; or when the light incident to the image sensor includes visible light in ambient light and near-infrared light emitted by a near-infrared light source, the color-determined subunit may allow light of a color other than a complementary color of the color-determined subunit in the visible light to pass through, and reflect or absorb light corresponding to the complementary color of the color-determined subunit and the near-infrared light. A transparent color film may transmit the visible light and the near-infrared light.

Figures 22, 23:
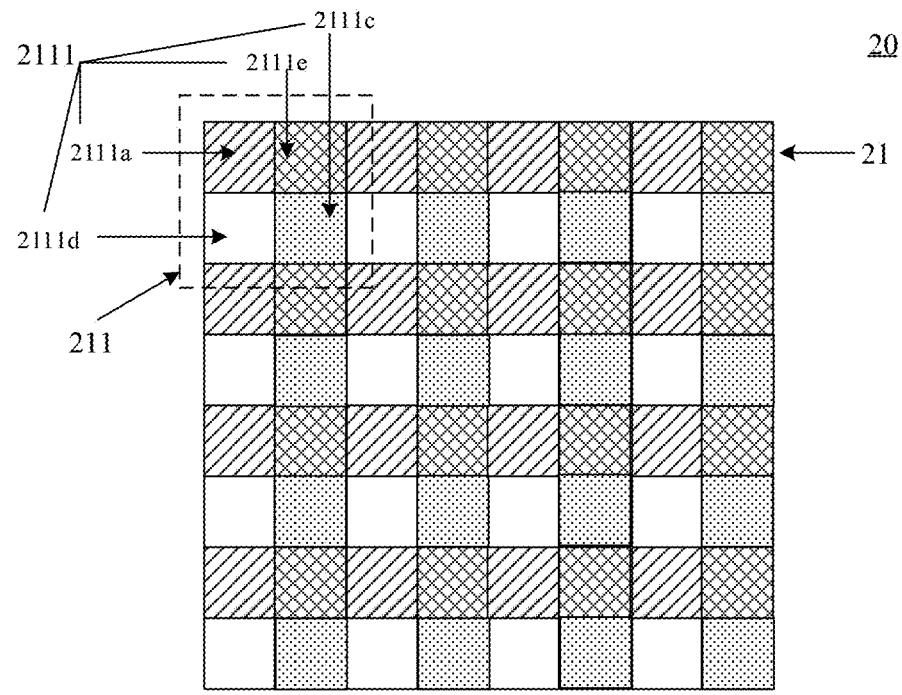
FIG. 22 is a schematic diagram of still another image sensor according to an embodiment of this application.
FIG. 23 is a schematic diagram of a further color film layer according to an embodiment of this application.

FIG. 22 shows another image sensor 20 according to an embodiment of this application. The image sensor 20 includes a color film layer 21, a photodiode (not shown in FIG. 22), a microlens (not shown in FIG. 22), and other structures. For a cross-sectional view of the image sensor 20, refer to FIG. 3 and FIG. 4. The color film layer 21 is disposed between the photodiode and the microlens. For related descriptions of the structures such as the photodiode and the microlens in the image sensor shown in FIG. 22, and the image sensor, refer to related descriptions of the first-type image sensor. Details are not described herein again in an embodiment of the application.

As shown in FIG. 22, the color film layer 21 includes a plurality of color film units 211, and the color film unit 211 includes a plurality of subunits 2111. The plurality of subunits 2111 may include at least three color-determined subunits. A color of the color-determined subunit is determined, and the color-determined subunit is configured to filter out some of light. A color of the portion of the received light is a complementary color of the color of the color-determined subunit. In other words, the color-determined subunit may be configured to allow light of a color other than the complementary color of the color-determined subunit in the light to pass through. A ratio of a quantity of the at least three color-determined subunits to a quantity of the plurality of subunits is greater than 1/2.

FIG. 22 shows a case in which each color film unit 211 includes four subunits 2111. The four subunits include three color-determined subunits (that is, a subunit 2111a, a subunit 2111e, and a subunit 2111c) and one transparent subunit 2111d. The transparent subunit is configured to allow light to pass through. In an embodiment, the four subunits are arranged into one 2×2 subunit matrix.

In an embodiment, as shown in FIG. 23, four subunits included in each color film unit 211 include three color-determined subunits and one transparent subunit, and the three color-determined subunits may be cyan C, yellow Y, and magenta M.

In an embodiment, a plurality of color film units each include four subunits, and the four subunits may include four subunits. The four subunits are all color-determined subunits. Colors of three of the four color-determined subunits are cyan, yellow, and magenta, and the other one color-determined subunit is cyan, yellow, or magenta.

Certainly, a color film unit including four subunits may have the following three combination manners: four color-determined subunits of the color film unit are cyan, yellow, magenta, and cyan; and four color-determined subunits of the color film unit are cyan, yellow, magenta, and yellow; and four color-determined subunits of the color film unit are cyan, yellow, magenta, and magenta.

Figures 24, 25:
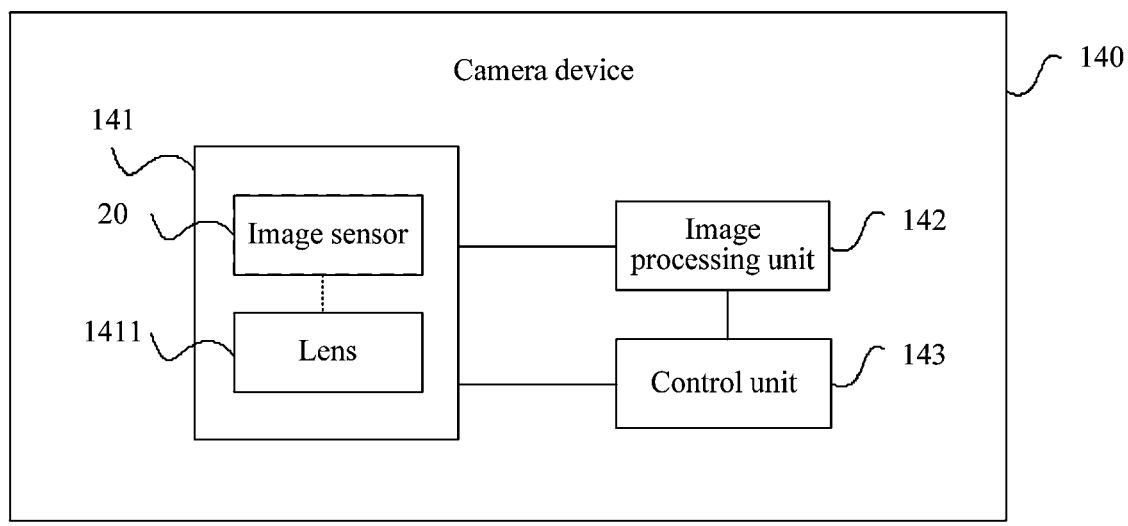
FIG. 24 is a schematic diagram of a further color film layer according to an embodiment of this application.
FIG. 25 is a schematic structural diagram of a camera device according to an embodiment of this application.

FIG. 24 shows a case in which four color-determined subunits in a color film unit 211 including 2×2 subunits are cyan C, yellow Y, magenta M, and magenta M, and the magenta M color-determined subunits are diagonally located in the color film unit to which the magenta M color-determined subunits belong.

For related descriptions of the complementary color, refer to related descriptions of the first-type image sensor. Details are not described herein again. In the color film layer shown in FIG. 22 to FIG. 24, because the color-determined subunit 2111 can filter out light of the complementary color of the color of the color-determined subunit 2111 from light, a difference from the RGB color film commonly used in the related technology lies in that, a photodiode corresponding to the subunit 2111 can receive more light, thereby effectively increasing light sensitivity of image sensor.

In conclusion, the color film layer included in the image sensor provided in an embodiment of the application includes a plurality of color film units, each color film unit includes at least three color-determined subunits, and a ratio of a quantity of color-determined subunits to a quantity of the plurality of subunits is greater than 1/2. Because the color-determined subunit can allow light of a color other than a complementary color of the subunit in the light to pass through, most of light incident to the color-determined subunit can be received by the photodiode, and light sensitivity of the image sensor can be effectively increased without increasing an area of the color film layer or increasing a size of the photodiode, thereby implementing miniaturization of the image sensor.

FIG. 25 shows a camera device 140 according to an embodiment of this application. The camera device may include a compact camera module 141 and an image processing unit 142.

The compact camera module 141 may include the image sensor 20 described in the foregoing embodiment and a lens 1411. The compact camera module 141 may be configured to capture an image. The image processing unit 142 may be configured to process the image captured by the compact camera module 141. The compact camera module 141 is connected to the image processing unit 142.

In addition, the camera device 140 may further include a control unit 143. The control unit 143 may be connected to both the compact camera module 141 and the image processing unit 142. The control unit 143 may be a control center of the camera device 140, and may be configured to send a control signal to the compact camera module 141 to control the compact camera module 141 to capture an image, or send a control signal to the image processing unit 142 to control the image processing unit to process an image.

According to the camera device provided in an embodiment of the application, because the camera device includes the image sensor provided in the foregoing embodiment, the camera device can still collect a clear image with a relatively high luminance at night with relatively low light intensity. In addition, because a size of the image sensor does not need to be increased, miniaturization of the camera device is implemented. Further, manufacturing costs of the camera device can be further reduced.

Figure 26:
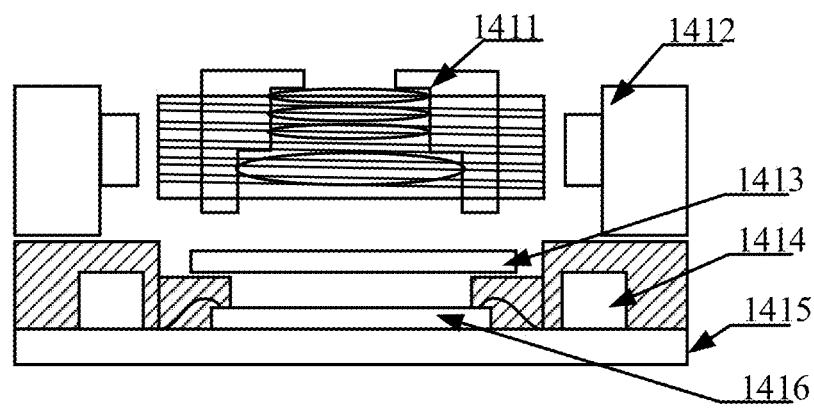
FIG. 26 is a schematic structural diagram of a compact camera module according to an embodiment of this application.

In an embodiment, FIG. 26 is a schematic structural diagram of the compact camera module 141 according to an embodiment of this application. The compact camera module 141 may be applied to an image sensor including an RGB color film layer. The compact camera module 141 includes a bearing structure and a lens module. The bearing structure includes a printed circuit board 1415, an image sensor 1416, an infrared cut filter (IR cut filter) 1413, and a surface mounting component 1414. The lens module includes a zoom module 1412 and a lens 1411. The image sensor 1416 may be the image sensor 20 in the foregoing embodiment.

The infrared cut-off filter may be movably disposed between the image sensor 1416 and the lens 1411. When light is adequate in the daytime, the infrared cut-off filter may be disposed between the image sensor 1416 and the lens 1411 to filter out near-infrared light. Because only visible light can be incident to the image sensor, the image sensor is not interfered with by the near-infrared light, and can reproduce a real image color. However, when light intensity is relatively weak at night, the infrared cut-off filter may be moved away from the image sensor 1416 and the lens 1411, so that the image sensor can fully use all light incident to the image sensor. In this way, light sensitivity of the image sensor is increased, but only a black-and-white photo can be output due to the interference of the near-infrared light.

However, in an image sensor including a CMY color film layer (a CMY color film layer that includes a transparent subunit) provided in an embodiment of this application, no infrared cut-off filter may be disposed, to obtain better sensitivity performance, and this also reduce production costs of the compact camera module to some extent. In addition, both an RGB color image and a near-infrared image can be obtained.

An embodiment of this application provides a surveillance system, including:
a management center and at least one camera, where the camera includes any camera device provided in the embodiments of this application, and the management center is configured to manage the at least one camera. In an embodiment of the application, the management center may be implemented in a plurality forms. For example, the management center is a server, a server cluster including several servers, or a cloud computing service center.

Figure 27:
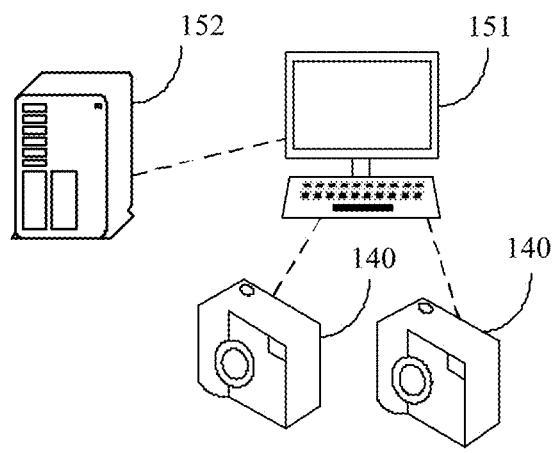
FIG. 27 is a schematic structural diagram of a surveillance system according to an embodiment of this application.

In an embodiment, the management center includes a surveillance platform and a storage server. FIG. 27 shows a surveillance system 150 according to an embodiment of this application. The surveillance system 150 may include a surveillance platform 151, a storage server 152, and at least one camera 140. The surveillance platform 151, the storage server 152, and the at least one camera 140 may be connected wiredly or wirelessly.

The at least one camera 140 may include the camera device shown in FIG. 25. For example, the camera device is a night camera device. The surveillance platform 152 is configured to provide an input/output interface or a graphical user interface for a surveillance person to operate, for example, a display screen or a keyboard. The surveillance platform 152 is further configured to perform image processing on an image captured by the camera 140, for example, perform target object recognition on the image by using a target object recognition algorithm. For example, the target object recognition algorithm may be a facial recognition algorithm. The storage server 151 may be a server, or a server cluster including several servers. The storage server 151 is configured to store an image transmitted by the surveillance platform, an image transmitted by the camera, or the like. The storage server may store data by using a distributed storage system. In FIG. 27, an example in which the surveillance system 150 includes two cameras 140 is used for description.

In an embodiment, the camera may be an internet protocol camera (IPC). Certainly, the camera device may be alternatively an apparatus with an image collection function, such as a front-facing or rear-facing camera of a mobile phone, a digital camera, a digital video camera, an on-board camera, or an industrial camera. The camera device may be applied to a security protection field, a photography field, an automotive electronics field, an industrial machine vision field, or the like.

In actual implementation of an embodiment of the application, the surveillance platform may include: an image recognition unit (for example, an artificial intelligence image recognition unit), configured to perform image recognition, for example, facial image recognition; a wired or wireless data transmission unit, configured to transmit data; a buffering unit, configured to buffer data; or a display screen or a monitor, configured to display a captured image.

Figure 28:
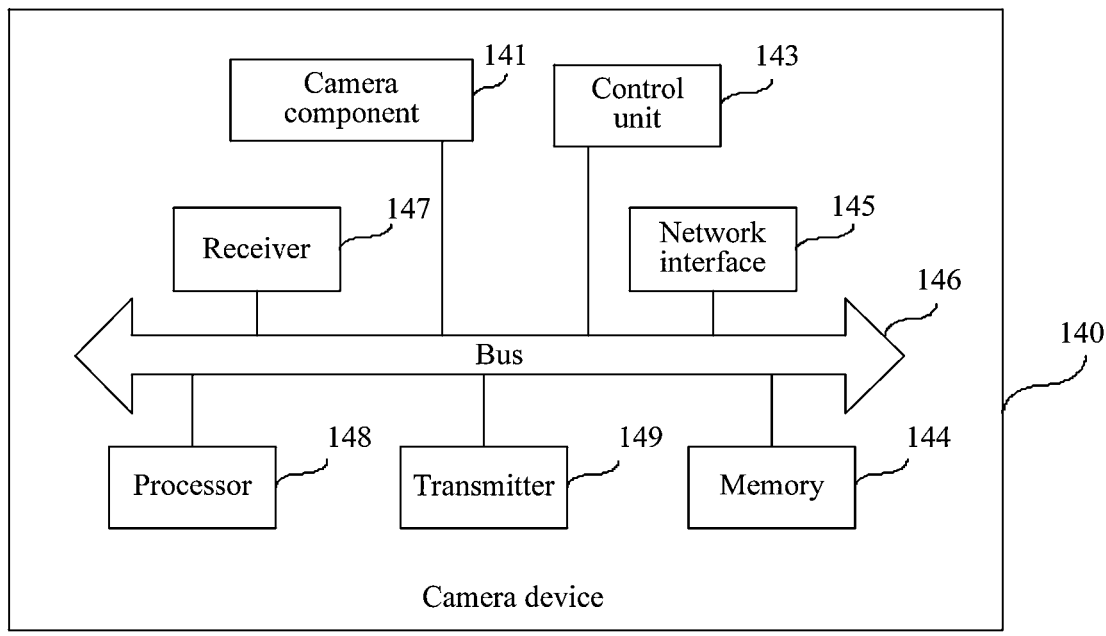
FIG. 28 is a schematic structural diagram of a camera related to an embodiment of this application.

FIG. 28 is a schematic structural diagram of the camera 140 related to an embodiment of the present application. The camera 140 may be any camera in the surveillance system shown in FIG. 27.

Referring to FIG. 28, the camera 140 includes a receiver 147 and a processor 148. The receiver 147 and the processor 148 are connected by using a bus 146. The processor 148 includes one or more processing cores. The processor 148 executes various functional applications and data processing by running a software program and a unit. The processor 148 may have a function the same as or similar to that of the image processing unit 142 shown in FIG. 25.

In an embodiment, as shown in FIG. 28, the camera 140 further includes at least one of a memory 144, a network interface 145, and a transmitter 149. The memory 144, the network interface 145, and the transmitter 149 are all connected to the receiver 147 and the processor 148 by using the bus 146.

There may be a plurality of network interfaces 145, and the network interface 145 is used by the camera 140 to communicate with another storage device or network device. The network interface 145 is optional. In actual application, the camera 140 may communicate with another storage device or network device by using the receiver 147 and the transmitter 149. Therefore, the camera 140 may not have a network interface. This is not limited in an embodiment of the present application.

In an embodiment, as shown in FIG. 28, the camera 140 further includes a camera component 141 and a control unit 143. The camera component 141 is connected to the processor 142 by using the bus 146, and the control unit 143 is connected to the receiver 141, the network interface 145, the processor 142, the transmitter 149, the memory 144, and the camera component 141 by using the bus 146.

An embodiment of this application provides a method for obtaining image data from an image sensor. The method may be performed by the processor in the foregoing camera device. The image sensor includes a color film layer, the color film layer includes a plurality of color film units, and the color film unit includes one original color-determined subunit and three transparent subunits, that is, the color film unit includes four subunits. For example, the four subunits may be subunits arranged into a two-row and two-column matrix. The original color-determined subunit is configured to filter out light of a color other than a color of the original color-determined subunit, and the transparent subunit is configured to allow light to pass through. It should be noted that the color of the subunit itself may also be referred to as a color of the subunit.

In an embodiment, the color film layer is an RGB color film layer. The color film layer has three different colors: red R, green G, and blue B. A color of one color-determined subunit included in each color film unit may be one of the three different colors: red R, green G, and blue B. When the color of the color-determined subunit is red R, the color-determined subunit may be configured to filter out light of a color other than red R from light, that is, the color-determined subunit may be configured to filter out green G light and blue B light from the light. Correspondingly, when the color of the color-determined subunit is green G, the color-determined subunit may be configured to filter out blue B light and red R light from light; or when the color of the color-determined subunit is blue B, the color-determined subunit may be configured to filter out green G light and red R light from light.

A first transparent subunit is a transparent subunit, in the color film layer, of which there is a color-determined subunit in four neighborhoods. A second transparent subunit is a transparent subunit other than the first transparent subunit in a plurality of transparent subunits in the color film layer. Four neighborhoods of a transparent subunit refer to four adjacent positions in four directions of the transparent subunit: an upper direction, a lower direction, a left direction, and a right direction.

Figure 29:
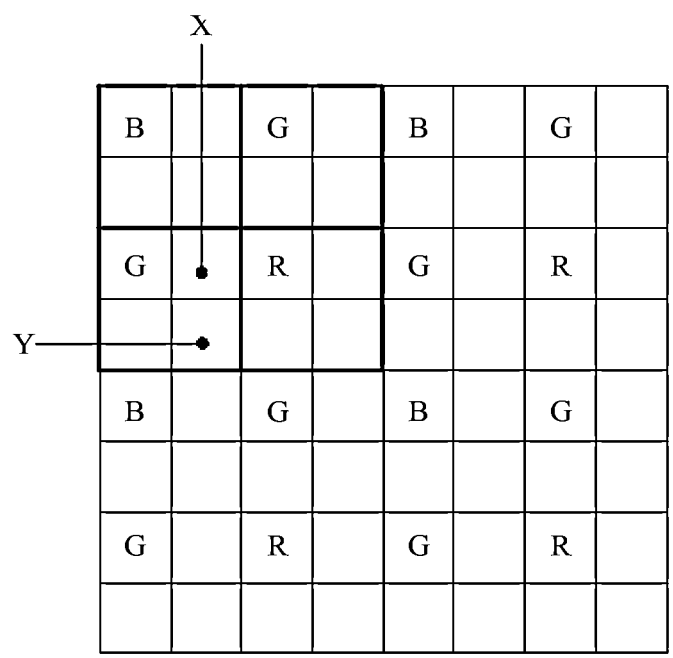
FIG. 29 is a schematic diagram of a further color film layer according to an embodiment of this application.

Referring to FIG. 29, based on the embodiment shown in FIG. 6, FIG. 29 shows a first transparent subunit X and a second transparent subunit Y. It can be seen from FIG. 29 that, there are color-determined subunits (a green G subunit and a red R subunit) in left and right neighborhoods of four neighborhoods of the first transparent subunit X, and the second transparent subunit Y is a transparent subunit other than the first transparent subunit in a plurality of transparent subunits in the color film layer, that is, a transparent subunit of which there is no color-determined subunit in four neighborhoods in the color film layer.

Figure 30:
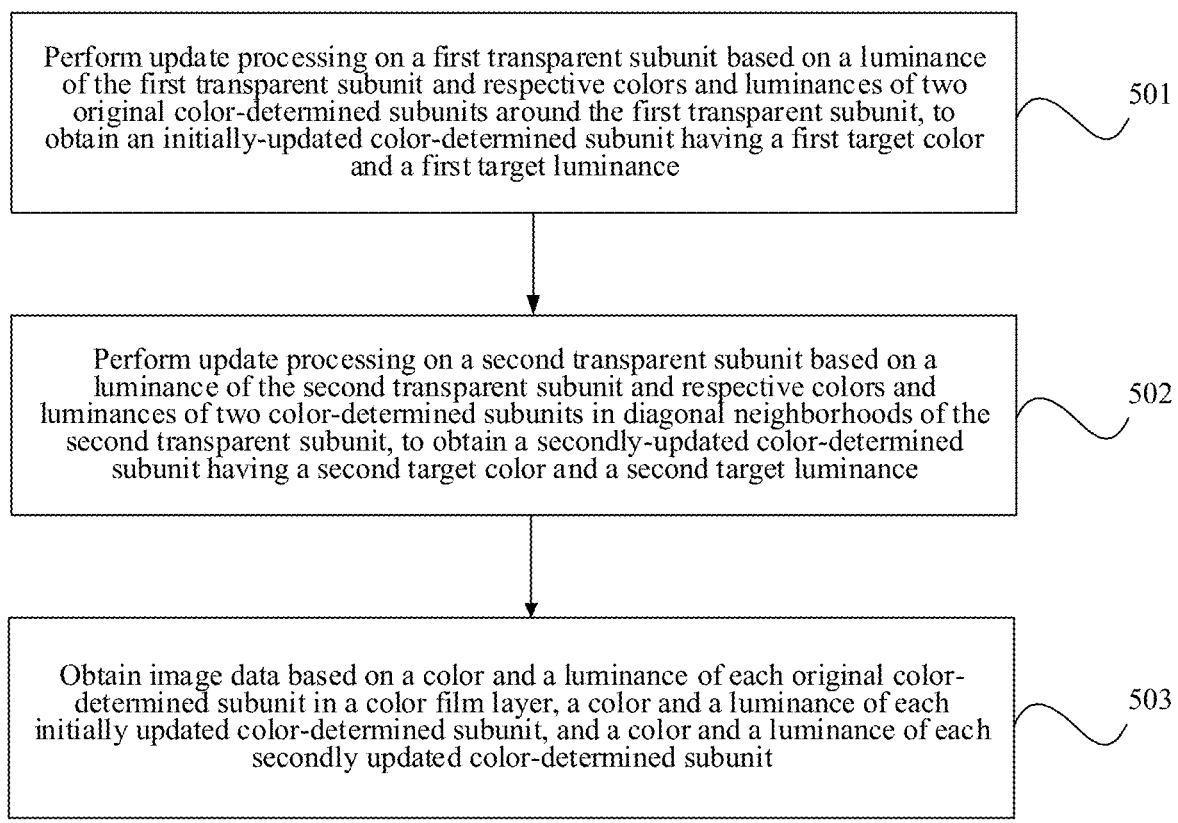
FIG. 30 is a flowchart of a method for obtaining image data from an image sensor according to an embodiment of this application.

Because there are a plurality of transparent subunits on the image sensor, it needs to be ensured that all subunits each have a determined color in finally obtained image data, so as to implement effective color reproduction and improve a final image display effect. Therefore, each transparent subunit needs to be updated to a color-determined unit, and such a process of updating the transparent subunit to the color-determined unit may also be considered as a process of performing update processing on a color and a luminance of the transparent subunit. As shown in FIG. 30, the method for obtaining image data may include the following operations.

Operation 501: Perform update processing on the first transparent subunit based on both a luminance and colors of the first transparent subunit and luminances of two original color-determined subunits around the first transparent subunit, to obtain an initially-updated color-determined subunit having a first target color and a first target luminance.

Surroundings of a transparent subunit refer to areas of eight neighborhoods and extension directions of the eight neighborhoods of the transparent subunit. The extension directions of the eight neighborhoods refer to an upper part of an upper part, a lower part of a lower part, a left side of a left side, a right side of a right side, an upper-left part of an upper-left part, a lower-left part of a lower-left part, an upper-right part of an upper-right part, and a lower-right part of a lower-right part. The eight neighborhoods of the transparent subunit include four neighborhoods and diagonal neighborhoods. The diagonal neighborhoods of the transparent subunit refer to four positions adjacent to the transparent subunit: upper left, lower left, upper right, and lower right. The eight neighborhoods of the transparent subunit refer to eight adjacent positions of the transparent subunit: upper, lower, left, right, upper left, lower left, upper right, and lower right. The diagonal neighborhoods and the extension directions of the eight neighborhoods of the transparent subunit may also be considered as areas other than the four neighborhoods of the surroundings of the transparent subunit.

The two original color-determined subunits have different colors, and based on different positions of the two original color-determined subunits, the following two cases may be included. In a first case, the two original color-determined subunits are both located in the four neighborhoods of the first transparent subunit. In a second case, one of the two original color-determined subunits is located in the four neighborhoods of the first transparent subunit, and the other is located in diagonal neighborhoods or extension directions of eight neighborhoods of the first transparent subunit.

In an embodiment, in operation 501, the operation of performing update processing on the first transparent subunit may include the following operations.

Operation 501a: Use, as the first target color, a color other than the colors of the two original color-determined subunits around the first transparent subunit in light passing through the first transparent subunit.

The light passing through the first transparent subunit may be white light, and the white light may be considered as a mixture of three primary optical colors RGB. The three primary optical colors RGB that produce the white light may respectively correspond to three types of color-determined subunits in the RGB color film layer in an embodiment of the application. The three primary optical colors RGB are colors required by finally obtained image data.

Operation 501b: Use, as the first target luminance, a difference between the luminance of the first transparent subunit and a sum of the luminances of the two original color-determined subunits around the first transparent subunit.

Operation 501c: Perform update processing on the first transparent subunit to obtain the initially-updated color-determined subunit, where a color of the initially-updated color-determined subunit is the first target color, and a luminance of the initially-updated color-determined subunit is the first target luminance.

In an embodiment of the application, a process of updating each first transparent subunit depends on an original color-determined subunit in the four neighborhoods of the first transparent subunit in the color film layer, and a position of the one original color-determined subunit included in each color film unit may be different. As described in operation 501, based on different positions of the two original color-determined subunits used when update processing is performed on the first transparent subunit, there may be the following two cases. The following uses the two cases as examples to describe a process of operation 5011 to operation 5013.

In a first case, the two original color-determined subunits are both located in the four neighborhoods of the first transparent subunit.

Figure 31:
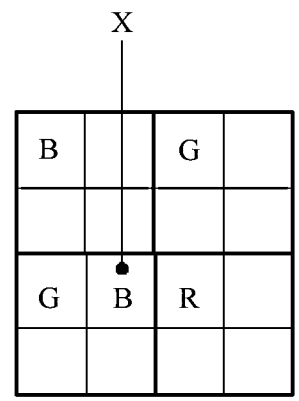
FIG. 31 is a schematic partial view of a color film layer according to an embodiment of this application.
Figure 32:
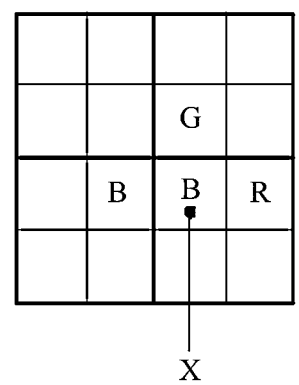
FIG. 32 is a schematic partial view of a color film layer according to an embodiment of this application.

There are two sub-cases in this case. In a first sub-case, as shown in FIG. 31, there are original color-determined subunits of two colors in the four neighborhoods of the first transparent subunit X in the color film layer. In a second sub-case, as shown in FIG. 32, there are original color-determined subunits of three different colors in the four neighborhoods of the first transparent subunit X in the color film layer. The following separately describes, to the two sub-cases, the process of performing update processing on the first transparent subunit.

In the first sub-case, FIG. 31 shows a case in which there are a red subunit and a green subunit in the four neighborhoods of the first transparent subunit X, where red and green are colors of the two original color-determined subunits. Blue R, other than red R and green G of the three different colors producing white light, is determined as a first target color corresponding to the first transparent subunit X, and a difference between a luminance W of the first transparent subunit X and a sum of a luminance I1 of the red subunit and a luminance I2 of the green subunit is determined as a first target luminance I3 of blue B corresponding to the first transparent subunit X, that is, I3=W−(I1+I2). Update processing is performed on the first transparent subunit by using the first target luminance I3 and the first target color that is blue, to obtain an initially-updated blue subunit with the luminance I3.

Certainly, FIG. 31 is a schematic partial view of the color film layer, and one first transparent subunit X in one color film unit of a plurality of color film units is used as an example for description. For another first transparent subunit X in the first case, for updating a color and a luminance of the first transparent subunit X, refer to the embodiment described in FIG. 31.

In the first case, the process of updating the first transparent subunit may be applied to the image sensor including the color film layer shown in FIG. 6, FIG. 8, FIG. 9, and FIG. 10.

In the second sub-case, FIG. 32 shows a case in which there are original color-determined subunits of three different colors in the four neighborhoods of the first transparent subunit X, that is, there are a red subunit, a green subunit, and a blue subunit. Any two of the subunits of the three different colors are selected as the two original color-determined subunits. For example, if the red subunit and the green subunit of the subunits of the three different colors are selected as the two original color-determined subunits, blue other than red and green in the light passing through the first transparent subunit is determined as a first target color corresponding to the first transparent subunit X, and a difference between a luminance W of the first transparent subunit X and a sum of a luminance I1 of the red subunit and a luminance I2 of the green subunit is determined as a first target luminance I3 of blue corresponding to the first transparent subunit X, that is, I3=W−(I1+I2). Update processing is performed on the first transparent subunit by using the first target luminance I3 and the first target color that is blue, to obtain an initially-updated blue subunit with the luminance I3.

Certainly, FIG. 32 is a schematic partial view of the color film layer, and one first transparent subunit X in one color film unit of a plurality of color film units is used as an example for description. For another first transparent subunit X in the third case, for updating a color and a luminance of the first transparent subunit X, refer to the embodiment described in FIG. 32.

In a second case, one of the two original color-determined subunits is located in the four neighborhoods of the first transparent subunit, and the other is located in diagonal neighborhoods or extension directions of eight neighborhoods of the first transparent subunit. The other original color-determined subunit may be selected according to a preset selection rule. For example, different original color-determined subunits in different directions have different priorities, and/or color-determined subunits with different distances from the first transparent subunit have different priorities. The selection rule is: selecting a highest-priority original color-determined subunit of another color. For example, assuming that a priority of an original color-determined subunit is negatively correlated to a distance from the first transparent subunit, an original color-determined subunit that is closest to the first transparent subunit and that has another color may be selected. In the extension directions of the eight neighborhoods of the first transparent subunit, if there are at least two original color-determined subunits of another color (where the another color refers to a color different from the foregoing color) that are closest to the first transparent subunit, any one of the at least two original color-determined subunits may be selected as the original color-determined subunit of the another color.

Figure 33:
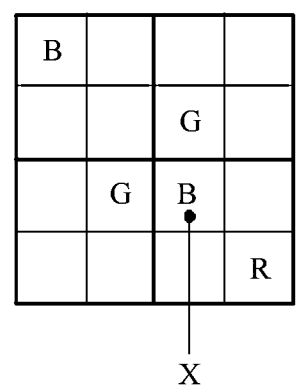
FIG. 33 is a schematic partial view of a color film layer according to an embodiment of this application.

For example, FIG. 33 shows a case in which there is a green subunit in the four neighborhoods of the first transparent subunit X. In the surroundings of the first transparent subunit X, an original color-determined subunit of another color is selected. For example, in a diagonal neighborhood direction of the first transparent subunit X, an original color-determined subunit of another color that is closest to the first transparent subunit X is red R; blue B other than red R and green G in light passing through the first transparent subunit is determined as a first target color corresponding to the first transparent subunit X; and a difference between a luminance W of the first transparent subunit X and a sum of a luminance I1 of the red R subunit and a luminance I2 of the green G subunit is determined as a first target luminance I3 of blue corresponding to the first transparent subunit X, that is, I3=W−(I1+I2). Update processing is performed on the first transparent subunit by using the first target luminance I3 and the first target color that is blue, to obtain an initially-updated blue subunit with the luminance I3.

Certainly, FIG. 33 is a schematic partial view of the color film layer, and one first transparent subunit X in one color film unit of a plurality of color film units is used as an example for description. For another first transparent subunit X in the second case, for updating a color and a luminance of the first transparent subunit X, refer to the embodiment described in FIG. 33.

In the second case, the process of updating the first transparent subunit to the color-determined subunit may be applied to the image sensor including the color film layer shown in FIG. 7, FIG. 11, FIG. 12, and FIG. 13.

Operation 502: Perform update processing on the second transparent subunit based on both a luminance and colors of the second transparent subunit and luminances of two color-determined subunits located in diagonal neighborhoods of the second transparent subunit, to obtain a secondly-updated color-determined subunit having a second target color and a second target luminance.

The two color-determined subunits have different colors, and the two color-determined subunits are both the original color-determined subunits, or both are the initially-updated color-determined subunits, or one is the original color-determined subunit and the other is the initially-updated color-determined subunit.

The process of performing update processing on the second transparent subunit may include the following operations:

Operation Q1: Use, as the second target color, a color other than the colors of the two color-determined subunits located in the diagonal neighborhoods of the second transparent subunit in light passing through the second transparent subunit.

Operation Q2: Use, as the second target luminance, a difference between the luminance of the second transparent subunit and a sum of the luminances of the two color-determined subunits located in the diagonal neighborhoods of the second transparent subunit.

Operation Q3: Perform update processing on the second transparent subunit to obtain the secondly-updated color-determined subunit, where a color of the secondly-updated color-determined subunit is the second target color, and a luminance of the secondly-updated color-determined subunit is the second target luminance.

FIG. 34 is a schematic diagram obtained after update processing is performed on the first transparent subunit based on the embodiment shown in FIG. 6.

FIG. 35 is a schematic diagram obtained after update processing is performed on the second transparent subunit based on the embodiment shown in FIG. 34. Green G other than red R and blue B of the two color-determined subunits located in the diagonal neighborhoods in the light passing through the second transparent subunit is used as the second target color. Certainly, FIG. 35 is merely an example for description. In actual implementation of an embodiment of this application, either red R or blue B may be determined as the second target color.

For the process of determining the second target luminance in operation Q2, refer to the foregoing process of determining the first target luminance. Details are not described herein again in an embodiment of the application.

It should be noted that, in the foregoing operations, a sequence for performing the operations of determining the target color and the target luminance of the transparent subunit may be correspondingly adjusted. For example, the target color of the transparent subunit may be first determined, and then the target luminance of the transparent subunit is determined; or the target luminance of the transparent subunit is first determined, and then the target color of the transparent subunit is determined. This is not limited in an embodiment of the application.

Operation 503: Obtain the image data based on a color and a luminance of each original color-determined subunit in the color film layer, a color and a luminance of each initially-updated color-determined subunit, and a color and a luminance of each secondly-updated color-determined subunit.

The image data may be used to form image pixels in an image. Each image pixel includes color components of three different colors: red R, green G, and blue B, and a color component of each color includes a color and a luminance that correspond to the color component.

After operation 501 and operation 502 are performed, each subunit in each of the plurality of color film units included in the color film layer has a color of the three different colors and a corresponding luminance. Subsequently, a color reproduction algorithm such as an interpolation algorithm may be used to use the obtained color and luminance of each subunit in the color film layer as image data to form each image pixel in the image.

In conclusion, according to the method for obtaining image data from an image sensor provided in an embodiment of the application, update processing is performed on the first transparent subunit based on both the luminance and the colors of the first transparent subunit and luminances of the original color-determined subunits, and then update processing is performed on the second transparent subunit based on both the luminance and the colors of the second transparent subunit and luminances of the two color-determined subunits, so that each subunit in the color film layer has a color and a luminance, to obtain the image data for image color reproduction. Because the transparent subunit that does not filter light is disposed in the color film layer, light sensitivity of the image sensor is increased. In addition, another color and a corresponding luminance that are required for image color reproduction may be further obtained based on both the luminance and the colors of the transparent subunit and luminances of the original color-determined subunits, thereby achieving an effect of accurate mage color reproduction.

An embodiment of this application provides another method for obtaining image data from an image sensor. The method may be performed by the processor in the foregoing camera device. The image sensor includes a color film layer, the color film layer includes a plurality of color film units, and the color film unit may include one original color-determined subunit and three transparent subunits, that is, the color film unit includes four subunits. For example, the four subunits may be subunits arranged into a two-row and two-column matrix. The original color-determined subunit is configured to filter out light of a complementary color of a color of the color-determined subunit, and the transparent subunit is configured to allow light to pass through. A first transparent subunit is a transparent subunit, in the color film layer, of which there is an original color-determined subunit in four neighborhoods. A second transparent subunit is a transparent subunit other than the first transparent subunit in a plurality of transparent subunits in the color film layer. For related descriptions of surroundings, eight neighborhoods, four neighborhoods, and diagonal neighborhoods, refer to related descriptions in the foregoing method for obtaining image data from an image sensor.

In an embodiment, the color film layer is a CMY film layer. The color film layer has three different colors: cyan C, magenta M, yellow Y. A color of one color-determined subunit included in each color film unit may be one of the three different colors CMY. When the color of the color-determined subunit is cyan C, the color-determined subunit may be configured to filter out light of a complementary color (that is, red R) of cyan C from light, that is, the color-determined subunit may be configured to filter out red R light from the light. Correspondingly, when the color of the color-determined subunit is magenta M, the color-determined subunit may be configured to filter out green G light from light; or when the color of the color-determined subunit is yellow Y, the color-determined subunit may be configured to filter out blue B light from light.

Figure 36:
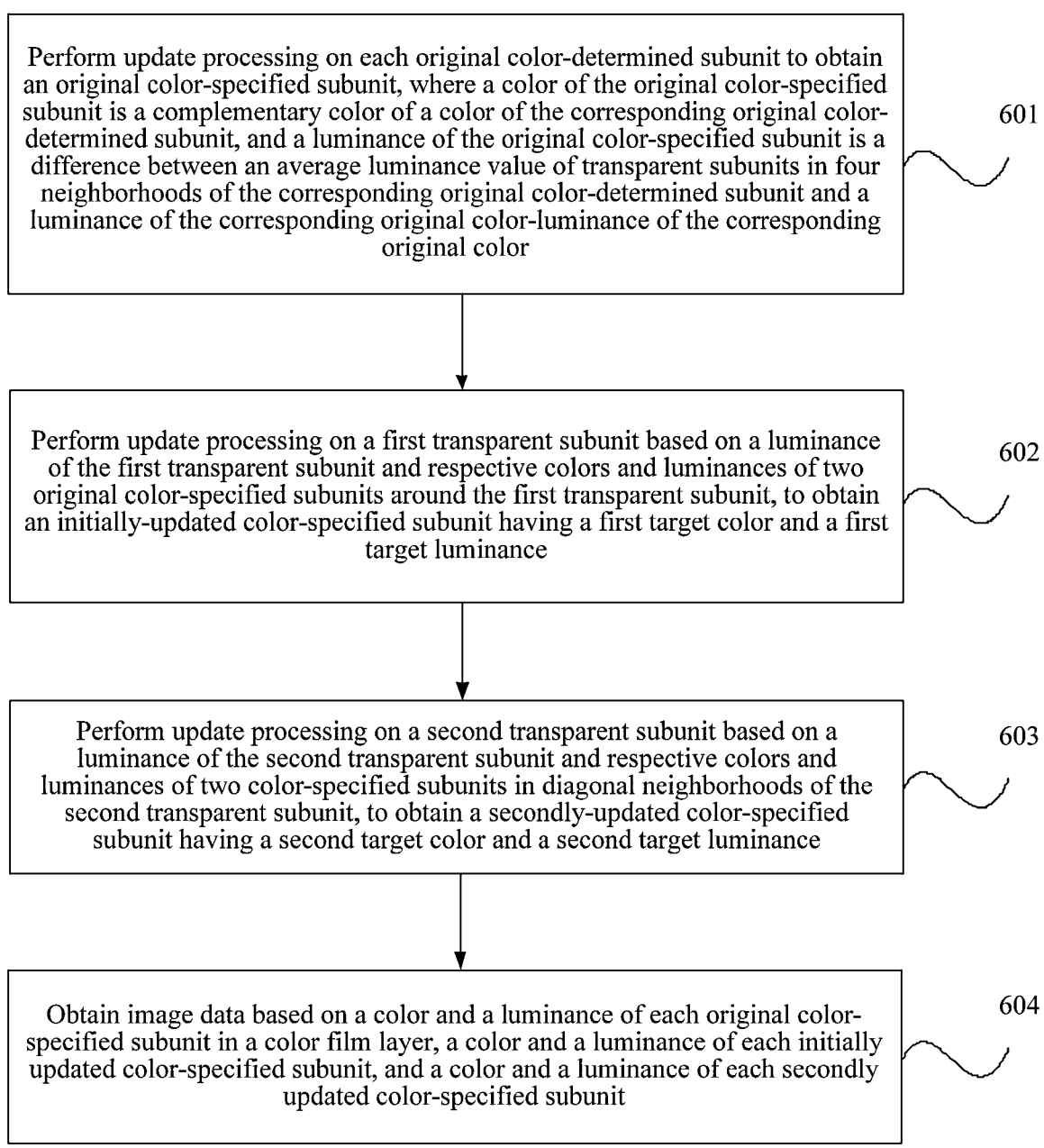
FIG. 36 is a flowchart of another method for obtaining image data from an image sensor according to an embodiment of this application.

Similar to a principle of the foregoing method for obtaining image data from an image sensor, the image sensor to which the another method for obtaining image data from an image sensor provided in an embodiment of the application is applied also includes a plurality of transparent subunits, and it needs to be ensured that all subunits each have a specified color in finally obtained image data, so as to implement effective color reproduction and improve a final image display effect. The specified color refers to one of red R, green G, and blue B. Therefore, in an embodiment of the application, not only each transparent subunit needs to be updated to a color-specified subunit, but also each color-determined subunit needs to be updated to a color-specified subunit. As shown in FIG. 36, the method for obtaining image data may include the following operations.

Operation 601: Perform update processing on each original color-determined subunit to obtain an original color-specified subunit, where a color of the original color-specified subunit is a complementary color of a color of the corresponding original color-determined subunit, and a luminance of the original color-specified subunit is a difference between an average luminance value of transparent subunits in four neighborhoods of the corresponding original color-determined subunit and a luminance of the corresponding original color-determined subunit.

For example, when the color of the original color-determined subunit is cyan C, cyan C of the original color-determined subunit is updated to red R of the original color-specified subunit; when the color of the original color-determined subunit is magenta M, magenta M of the original color-determined subunit is updated to green G of the original color-specified subunit; or when the color of the original color-determined subunit is yellow Y, yellow Y of the original color-determined subunit is updated to blue B of the original color-specified subunit.

For each color-determined subunit, a difference between an average luminance value of at least one transparent subunit in four neighborhoods of the color-determined subunit and a luminance of the color-determined subunit as the luminance of the corresponding original color-specified subunit. For example, when one transparent subunit is distributed in the four neighborhoods of the original color-determined subunit, a difference between a luminance of the transparent subunit distributed in the four neighborhoods of the original color-determined subunit and the luminance of the original color-determined subunit is taken to obtain the luminance of the corresponding original color-specified subunit. When a plurality of transparent subunits are distributed in the four neighborhoods of the original color-determined subunit, an average value may be taken for luminances of the plurality of transparent subunits, and then a difference between the average luminance value and the luminance of the original color-determined subunit is taken to obtain the luminance of the original color-specified subunit.

For example, when the color of the original color-determined subunit is yellow Y, and four transparent subunits are distributed in four neighborhoods of the original color-determined subunit, a luminance I1 of the yellow Y subunit, and a luminance I2, a luminance I3, a luminance I4, and a luminance I5 of the four transparent subunits are obtained, yellow Y of the original color-determined subunit is updated to blue B of the original color-specified subunit, and the luminance I1 of the original color-determined subunit is updated to a luminance I6 of the original color-specified subunit, where $I6=(I2+I3+I4+I5)/4-I1$.

Operation 602: Perform update processing on the first transparent subunit based on both a luminance and colors of the first transparent subunit and luminances of two original color-specified subunits around the first transparent subunit, to obtain an initially-updated color-specified subunit having a first target color and a first target luminance.

The two original color-specified subunits have different colors, and one of the two original color-specified subunits is located in the four neighborhoods of the first transparent subunit and the other is located in diagonal neighborhoods or extension directions of eight neighborhoods of the first transparent subunit; or the two original color-specified subunits are both located in the four neighborhoods of the first transparent subunit.

For schematic diagrams of the first transparent subunit and the second transparent subunit, refer to FIG. 29. Details are not described herein again in an embodiment of the application.

In an embodiment, in operation 602, the operation of performing update processing on the first transparent subunit may include the following operations.

Operation 602a: Use, as the first target color, a color other than the colors of the two original color-specified subunits around the first transparent subunit in light passing through the first transparent subunit.

Operation 602b: Use, as the first target luminance, a difference between the luminance of the first transparent subunit and a sum of the luminances of the two original color-specified subunits around the first transparent subunit.

Operation 602c: Perform update processing on the first transparent subunit to obtain the initially-updated color-specified subunit, where a color of the initially-updated color-specified subunit is the first target color, and a luminance of the initially-updated color-specified subunit is the first target luminance.

For a process of updating the first transparent subunit to obtain the first target color and the first target luminance in operation 602a to operation 602c, refer to the process of operation 502a to operation 502c. Details are not described herein again in an embodiment of the application.

Similar to the foregoing method for obtaining image data from an image sensor, in an embodiment of the application, the process of updating the first transparent subunit depends on the original color-determined subunit in the four neighborhoods of the first transparent subunit in the color film layer. For a position of the one original color-determined subunit included in the color film unit in each color film unit, there may be the following two cases. In a first case, the two original color-determined subunits are both located in the four neighborhoods of the first transparent subunit. In this case, there are color-determined subunits of two colors in the four neighborhoods of the first transparent subunit in the color film layer, and the process of updating the first transparent subunit may be applied to the image sensor including the color film layer shown in FIG. 14, FIG. 16, FIG. 17, and FIG. 18; or there are color-determined subunits of three different colors in the four neighborhoods of the first transparent subunit in the color film layer, and the process of updating the first transparent subunit may be applied to the image sensor including the color film layer shown in FIG. 23. In a second case, one of the two original color-determined subunits is located in the four neighborhoods of the first transparent subunit and the other is located in diagonal neighborhoods or extension directions of the eight neighborhoods of the first transparent subunit, and the process of updating the first transparent subunit may be applied to the image sensor including the color film layer shown in FIG. 15, FIG. 19, FIG. 20, and FIG. 21.

Operation 603: Perform update processing on the second transparent subunit based on both a luminance and colors of the second transparent subunit and luminances of two color-specified subunits located in diagonal neighborhoods of the second transparent subunit, to obtain a secondly-updated color-specified subunit having a second target color and a second target luminance.

The two color-specified subunits have different colors, and the two color-specified subunits are both the original color-specified subunits, or both are the initially-updated color-specified subunits, or one is the original color-specified subunit and the other is the initially-updated color-specified subunit.

The process of performing update processing on the second transparent subunit may include the following operations.

Operation T1: Use, as the second target color, a color other than the colors of the two color-specified subunits located in the diagonal neighborhoods of the second transparent subunit in light passing through the second transparent subunit.

Operation T2: Use, as the second target luminance, a difference between the luminance of the second transparent subunit and a sum of the luminances of the two color-specified subunits located in the diagonal neighborhoods of the second transparent subunit.

Operation T3: Perform update processing on the second transparent subunit to obtain the secondly-updated color-specified subunit, where a color of the secondly-updated color-specified subunit is the second target color, and a luminance of the secondly-updated color-specified subunit is the second target luminance.

For a process of updating the second transparent subunit in operation 603, refer to the process of updating the second transparent subunit in operation 502. Details are not described herein again in an embodiment of the application.

Operation 604: Obtain the image data based on a color and a luminance of each original color-specified subunit in the color film layer, a color and a luminance of each initially-updated color-specified subunit, and a color and a luminance of each secondly-updated color-specified subunit.

For a process of obtaining the image data in operation 604, refer to operation 503. Details are not described herein again in an embodiment of the application.

In conclusion, according to the method for obtaining image data from an image sensor provided in an embodiment of the application, a color and a luminance of each color-determined subunit are updated to a color and a luminance of an original color-specified subunit; update processing is performed on the first transparent subunit based on both the luminance and the colors of the first transparent subunit and luminances of the original color-specified subunits; then update processing is performed on the second transparent subunit based on both the luminance and the colors of the second transparent subunit and luminances of the two color-specified subunits, so that each subunit in the color film layer has a color and a luminance, to obtain the image data for image color reproduction. The transparent subunit that does not filter light is disposed in the color film layer, only portion of the received light of the complementary color of the color of the color-determined subunit can be filtered out from the light, and light of two colors other than the complementary color can be received by the image sensor. Therefore, compared with an image sensor provided with an RGB color film layer in a related technology, this effectively increases light sensitivity of the image sensor. In addition, another color and a corresponding luminance that are required for image color reproduction may be further obtained based on the luminance of the transparent subunit and the luminance of the original color-specified subunit, thereby achieving an effect of accurate image color reproduction.

Figure 37:
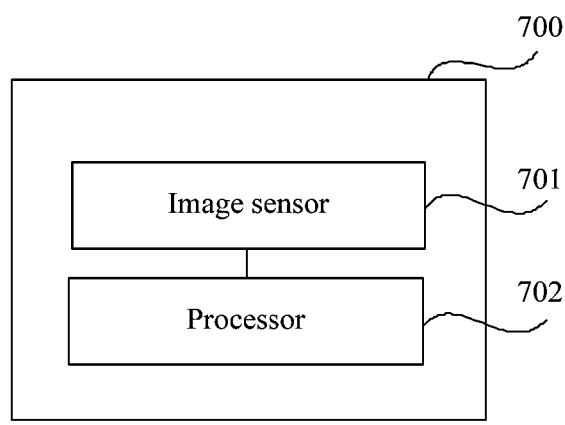
FIG. 37 is a schematic diagram of an apparatus for obtaining image data from an image sensor according to an embodiment of this application.

An embodiment of this application provides an apparatus 700 for obtaining image data from an image sensor. The apparatus 700 may be configured to perform the method for obtaining image data from an image sensor shown in FIG. 30. As shown in FIG. 37, the apparatus 700 includes an image sensor 701 and a processor 702. For example, the image sensor 701 includes a color film layer. The color film layer includes a plurality of color film units. The color film unit includes one original color-determined subunit and three transparent subunits. A color of the original color-determined subunit is determined. The original color-determined subunit is configured to filter out light of a color other than the color of the original color-determined subunit. The transparent subunit is configured to allow light to pass through. A first transparent subunit is a transparent subunit, in the color film layer, of which there is the color-determined subunit in four neighborhoods. A second transparent subunit is a transparent subunit other than the first transparent subunit in the plurality of the transparent subunits in the color film layer.

The processor 702 is configured to perform the following operations: performing update processing on the first transparent subunit based on both a luminance and colors of the first transparent subunit and luminances of two original color-determined subunits around the first transparent subunit, to obtain an initially-updated color-determined subunit having a first target color and a first target luminance, where the two original color-determined subunits have different colors, and one of the two original color-determined subunits is located in the four neighborhoods of the first transparent subunit and the other is located in diagonal neighborhoods or extension directions of eight neighborhoods of the first transparent subunit, or the two original color-determined subunits are both located in the four neighborhoods of the first transparent subunit;

performing update processing on the second transparent subunit based on both a luminance and colors of the second transparent subunit and luminances of two color-determined subunits located in diagonal neighborhoods of the second transparent subunit, to obtain a secondly-updated color-determined subunit having a second target color and a second target luminance, where the two color-determined subunits have different colors, and the two color-determined subunits are both the original color-determined subunits, or both are the initially-updated color-determined subunits, or one is the original color-determined subunit and the other is the initially-updated color-determined subunit; and obtaining the image data based on a color and a luminance of each original color-determined subunit in the color film layer, a color and a luminance of each initially-updated color-determined subunit, and a color and a luminance of each secondly-updated color-determined subunit.

In conclusion, according to the apparatus for obtaining image data from an image sensor provided in an embodiment of the application, update processing is performed on the first transparent subunit based on both the luminance and colors of the first transparent subunit and luminances of the original color-determined subunits, and then update processing is performed on the second transparent subunit based on both the luminance and colors of the second transparent subunit and luminances of the two color-determined subunits, so that each subunit in the color film layer has a color and a luminance, to obtain the image data for image color reproduction. Because the transparent subunit that does not filter light is disposed in the color film layer, light sensitivity of the image sensor is increased. In addition, another color and a corresponding luminance that are required for image color reproduction may be further obtained based on both the luminance and colors of the transparent subunit and luminances of the original color-determined subunits, thereby achieving an effect of accurate mage color reproduction.

Figure 38:
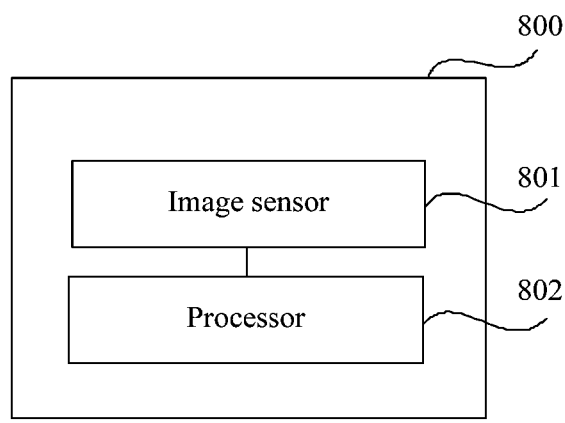
FIG. 38 is a schematic diagram of another apparatus for obtaining image data from an image sensor according to an embodiment of this application.

An embodiment of this application provides an apparatus 800 for obtaining image data from an image sensor. The apparatus 800 may be configured to perform the method for obtaining image data from an image sensor shown in FIG. 36. As shown in FIG. 38, the apparatus 800 includes an image sensor 801 and a processor 802. For example, the image sensor 801 includes a color film layer. The color film layer includes a plurality of color film units. The color film unit includes one original color-determined subunit and three transparent subunits. A color of the original color-determined subunit is determined. The original color-determined subunit is configured to filter out light of a complementary color of the color of the original color-determined subunit. The transparent subunit is configured to allow light to pass through. A first transparent subunit is a transparent subunit, in the color film layer, of which there is the original color-determined subunit in four neighborhoods. A second transparent subunit is a transparent subunit other than the first transparent subunit in the plurality of the transparent subunits in the color film layer.

The processor 802 is configured to perform the following operations:

performing update processing on each original color-determined subunit to obtain an original color-specified subunit, where a color of the original color-specified subunit is a complementary color of a color of the corresponding original color-determined subunit, and a luminance of the original color-specified subunit is a difference between an average luminance value of transparent subunits in four neighborhoods of the corresponding original color-determined subunit and a luminance of the corresponding original color-determined subunit.

performing update processing on the first transparent subunit based on both a luminance and colors of the first transparent subunit and luminances of two original color-specified subunits around the first transparent subunit, to obtain an initially-updated color-specified subunit having a first target color and a first target luminance, where the two original color-specified subunits have different colors, and one of the two original color-specified subunits is located in the four neighborhoods of the first transparent subunit and the other is located in diagonal neighborhoods or extension directions of eight neighborhoods of the first transparent subunit, or the two original color-specified subunits are both located in the four neighborhoods of the first transparent subunit;

performing update processing on the second transparent subunit based on both a luminance and colors of the second transparent subunit and luminances of the two color-specified subunits located in diagonal neighborhoods of the second transparent subunit, to obtain a secondly-updated color-specified subunit having a second target color and a second target luminance, where the two color-specified subunits have different colors, and the two color-specified subunits are both the original color-specified subunits, or both are the initially-updated color-specified subunits, or one is the original color-specified subunit and the other is the initially-updated color-specified subunit; and obtaining the image data based on a color and a luminance of each original color-specified subunit in the color film layer, a color and a luminance of each initially-updated color-specified subunit, and a color and a luminance of each secondly-updated color-specified subunit.

In conclusion, according to the apparatus for obtaining image data from an image sensor provided in an embodiment of the application, a color and a luminance of each color-determined subunit are updated to a color and a luminance of an original color-specified subunit; update processing is performed on the first transparent subunit based on both the luminance and colors of the first transparent subunit and luminances of the original color-specified subunits; then update processing is performed on the second transparent subunit based on both the luminance and colors of the second transparent subunit and luminances of the two color-specified subunits, so that each subunit in the color film layer has a color and a luminance, to obtain the image data for image color reproduction. The transparent subunit that does not filter light is disposed in the color film layer, only portion of the received light of the complementary color of the color of the color-determined subunit can be filtered out from the light, and light of two colors other than the complementary color can be received by the image sensor. Therefore, compared with an image sensor provided with an RGB color film layer in a related technology, this effectively increases light sensitivity of the image sensor. In addition, another color and a corresponding luminance that are required for image color reproduction may be further obtained based on the luminance of the transparent subunit and the luminance of the original color-specified subunit, thereby achieving an effect of accurate image color reproduction.

In the embodiments of this application, array-based arrangement means that structural units with a same structure or similar structures are linearly arranged. In an arrangement direction, every two adjacent structural units may be mirror-symmetrical or completely the same.

The foregoing descriptions are merely embodiments of this application, but are not intended to limit this application. Any modification, equivalent replacement, or improvement made without departing from the spirit and principle of this application shall fall within the protection scope of this application.

The term "and/or" in the present application describes only an association relationship for describing associated objects and represents that three relationships may exist. For example, A and/or B may represent the following three cases: Only A exists, both A and B exist, and only B exists. In addition, the character "/" in this specification usually indicates an "or" relationship between the associated objects.

What is claimed is:

1. An image sensor, comprising:
   a color film layer, comprising a plurality of color film units, each color film unit comprising four subunits having at least one color-determined subunit and at least three transparent subunits, wherein when a color of a color-determined subunit is determined, the color-determined subunit is configured to filter out a portion of received light, wherein a transparent subunit is configured to allow light to pass through to be received by a photodiode, to increase a light sensitivity of the image sensor; and
   wherein a ratio of a quantity of the at least one color-determined subunit to a total quantity of subunits in the color film unit is less than 1/2,
   wherein a minimum combination unit comprises four color film unit arranged in a matrix form and four color-determined subunits of the four color film unit are distributed around a center of the minimum combination unit.

2. The image sensor according to claim 1, wherein a color of the portion of the received light is a color other than the color of the color-determined subunit, wherein the color film layer comprises a plurality of color film unit arrays, and wherein each color film unit array comprises four color film units; and
   in three of the four color film units, the color-determined subunits are red, green, and blue, and wherein in the other one of the four color film units, the color-determined subunit is red, green, or blue.

3. The image sensor according to claim 2, wherein the four color film units are arranged into one 2×2 color film unit matrix, and wherein when the color-determined subunit in the other one color film unit is green, two color film units whose color-determined subunits are both green are diagonally arranged in the color film unit matrix.

4. The image sensor according to claim 1, wherein the four subunits comprise one color-determined subunit and three transparent subunits.

5. The image sensor according to claim 4, wherein a color of the portion of the received light is a color other than the color of the color-determined subunit, the color film layer comprises a plurality of color film unit arrays, and wherein each color film unit array comprises four color film units; and
   in three of the four color film units, the color-determined subunits are red, green, and blue, and wherein in the other one of the four color film units, the color-determined subunit is red, green, or blue.

6. The image sensor according to claim 4, wherein a color of the portion of the received light is a color other than the color of the color-determined subunit; and wherein in every two adjacent color film units in the color film layer,
   the color-determined subunit in one color film unit is red, and the color-determined subunit in the other color film unit is blue;
   the color-determined subunit in one color film unit is red, and the color-determined subunit in the other color film unit is green; or
   the color-determined subunit in one color film unit is blue, and the color-determined subunit in the other color film unit is green.

7. The image sensor according to claim 4, wherein a color of the portion of the received light is a complementary color of the color of the color-determined subunit;
   wherein the color film layer comprises a plurality of color film unit arrays, and each color film unit array comprises four color film units; and
   wherein in three of the four color film units, the colors of the color-determined subunits are cyan, yellow, and magenta, and in the other one of the four color film units, the color-determined subunit is cyan, yellow, or magenta.

8. The image sensor according to claim 7, wherein the four color film units are arranged into one 2×2 color film unit matrix, and wherein when the color-determined subunit in the other one color film unit is magenta, two color film units whose color-determined subunits are both magenta are diagonally arranged in the color film unit matrix.

9. The image sensor according to claim 4, wherein a color of the portion of the received light is a complementary color of the color of the color-determined subunit; and wherein in every two adjacent color film units in the color film layer,
   the color-determined subunit in one color film unit is cyan, and the color-determined subunit in the other color film unit is yellow;
   the color-determined subunit in one color film unit is magenta, and the color-determined subunit in the other color film unit is yellow; or the color-determined subunit in one color film unit is cyan, and the color-determined subunit in the other color film unit is magenta.

10. The image sensor according to claim 1, wherein the color film unit comprises nine subunits, and wherein the nine subunits comprise two color-determined subunits and seven transparent subunits.

11. The image sensor according to claim 1, further comprising the photodiode and a microlens, and wherein the color film layer is disposed between the photodiode and the microlens.

12. An image sensor, comprising:
a color film layer, comprising a plurality of color film units, each color film unit comprising four subunits having at least three color-determined subunits and at least one transparent subunit; wherein
when a color of a color-determined subunit is determined, the color-determined subunit is configured to filter out portion of the received light, a transparent subunit is configured to allow light to pass through to be received by a photodiode, to increase a light sensitivity of the image sensor, a color of the portion of the received light is a complementary color of the color of the color-determined subunit, and a ratio of a quantity of the at least three color-determined subunits to a total quantity of subunits in the color film unit is greater than 1/2,
wherein a minimum combination unit comprises four color film unit arranged in a matrix form and four color-determined subunits of the four color film unit are distributed around a center of the minimum combination unit.

13. The image sensor according to claim 12, wherein the four subunits comprise three color-determined subunits and one transparent subunit, wherein colors of the three color-determined subunits are cyan, yellow, and magenta.

14. The image sensor according to claim 12, wherein the four subunits are all color-determined subunits, wherein colors of three of the four subunits are cyan, yellow, and magenta, and wherein a color of the other one of the four subunits is cyan, yellow, or magenta.

15. The image sensor according to claim 12, wherein the four subunits are arranged into one 2×2 subunit matrix.

16. The image sensor according to claim 12, wherein a color of the portion of the received light is a color other than the color of the color-determined subunit; and wherein in every two adjacent color film units in the color film layer,
the color-determined subunit in one color film unit is red, and the color-determined subunit in the other color film unit is blue;
the color-determined subunit in one color film unit is red, and the color-determined subunit in the other color film unit is green; or
the color-determined subunit in one color film unit is blue, and the color-determined subunit in the other color film unit is green.

17. The image sensor according to claim 12, wherein a color of the portion of the received light is a complementary color of the color of the color-determined subunit;
wherein the color film layer comprises a plurality of color film unit arrays, and each color film unit array comprises four color film units; and
wherein in three of the four color film units, colors of the color-determined subunits are cyan, yellow, and magenta, and in the other one of the four color film units, a color of the color-determined subunit is cyan, yellow, or magenta.

18. The image sensor according to claim 17, wherein the four color film units are arranged into one 2×2 color film unit matrix, and wherein when the color-determined subunit in the other one color film unit is magenta, two color film units whose color-determined subunits are both magenta are diagonally arranged in the color film unit matrix.

19. The image sensor according to claim 12, wherein a color of the portion of the received light is a complementary color of the color of the color-determined subunit; and wherein in every two adjacent color film units in the color film layer,
the color-determined subunit in one color film unit is cyan, and the color-determined subunit in the other color film unit is yellow;
the color-determined subunit in one color film unit is magenta, and the color-determined subunit in the other color film unit is yellow; or
the color-determined subunit in one color film unit is cyan, and the color-determined subunit in the other color film unit is magenta.

* * * * *

UNITED STATES PATENT AND TRADEMARK OFFICE
CERTIFICATE OF CORRECTION

PATENT NO. : 12,243,902 B2
APPLICATION NO. : 17/231319
DATED : March 4, 2025
INVENTOR(S) : Yufeng Dai and Hongyi Qin Page 1 of 1

It is certified that error appears in the above-identified patent and that said Letters Patent is hereby corrected as shown below:

On the Title Page

Item (30), Foreign Priority data is missing. Insert --CHINA 201910105272.0 02/01/2019--.

Signed and Sealed this
Tenth Day of June, 2025

Coke Morgan Stewart
*Acting Director of the United States Patent and Trademark Office*